US012592554B2

(12) United States Patent
Jakupi et al.

(10) Patent No.: US 12,592,554 B2
(45) Date of Patent: Mar. 31, 2026

(54) CENTRALIZED FAULT DETECTION WITH FAULT RECOVERY SYSTEM AND METHOD

(71) Applicant: Schneider Electric USA, Inc., Andover, MA (US)

(72) Inventors: Andi Jakupi, Marion, IA (US); Chad R. Mittelstadt, Cedar Rapids, IA (US)

(73) Assignee: Schneider Electric USA, Inc., Boston, MA (US)

( * ) Notice: Subject to any disclaimer, the term of this patent is extended or adjusted under 35 U.S.C. 154(b) by 207 days.

(21) Appl. No.: 18/376,917

(22) Filed: Oct. 5, 2023

(65) Prior Publication Data

US 2024/0195165 A1      Jun. 13, 2024

Related U.S. Application Data

(60) Provisional application No. 63/431,439, filed on Dec. 9, 2022.

(51) Int. Cl.
| | |
|---|---|
| *H02H 1/00* | (2006.01) |
| *G01R 31/12* | (2020.01) |
| *G01R 31/52* | (2020.01) |

(52) U.S. Cl.
CPC ....... *H02H 1/0015* (2013.01); *G01R 31/1272* (2013.01); *G01R 31/52* (2020.01)

(58) Field of Classification Search
CPC ... H02H 1/0015; G01R 31/52; G01R 31/1272
See application file for complete search history.

(56) References Cited

U.S. PATENT DOCUMENTS

| | | | | |
|---|---|---|---|---|
| 4,251,702 A | * | 2/1981 | Castonguay | ......... H01H 3/3026 |
| | | | | 200/400 |
| 2014/0211345 A1 | * | 7/2014 | Thompson | .............. B60L 53/68 |
| | | | | 335/11 |
| 2019/0339961 A1 | | 11/2019 | Jakupi | |
| 2022/0271523 A1 | | 8/2022 | Lilly | |

FOREIGN PATENT DOCUMENTS

| | | |
|---|---|---|
| WO | 2021168233 A1 | 8/2021 |

OTHER PUBLICATIONS

International Search Report and Written Opinion dated Apr. 10, 2024 for corresponding International Application No. PCT/US23/83175, 18 pages.

* cited by examiner

*Primary Examiner* — Scott Bauer
(74) *Attorney, Agent, or Firm* — Wolf, Greenfield & Sacks, P.C.

(57) ABSTRACT

A method and system are provided for load or branch circuit recovery from a fault(s) on an electrical system. The method and system energize, at a branch device, a branch circuit after expiry of a predetermined disconnection period of time that was initiated in response to a detected arc fault on the branch circuit. The method and system update a data value representing a number of times an attempt has been made to energize the branch circuit in response to detected arc faults on the branch circuit. Upon determining that the data value satisfies or crosses an attempt threshold, the method and system prevent or delay at the branch device the energizing of the branch circuit.

31 Claims, 17 Drawing Sheets

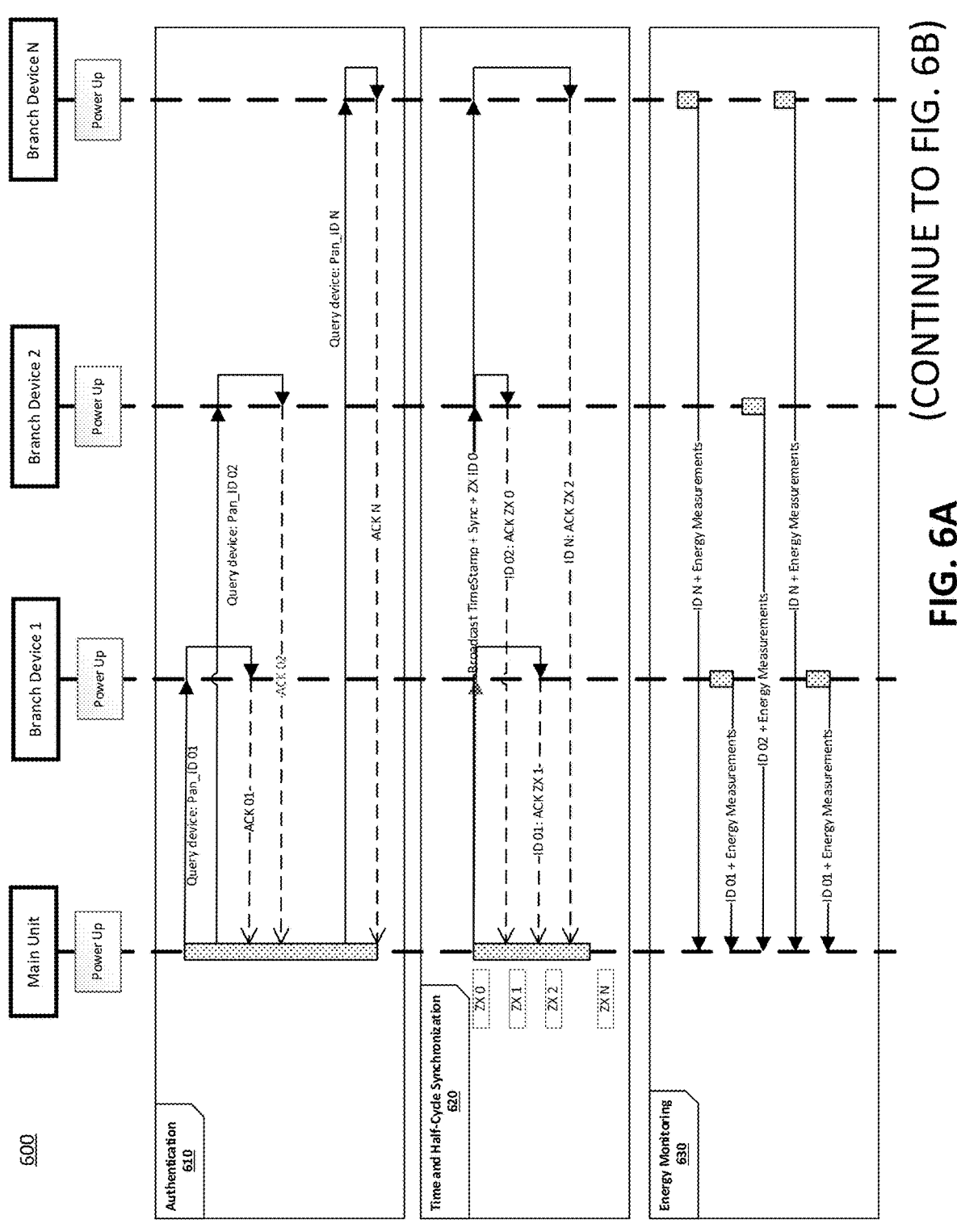
FIG. 6A     (CONTINUE TO FIG. 6B)

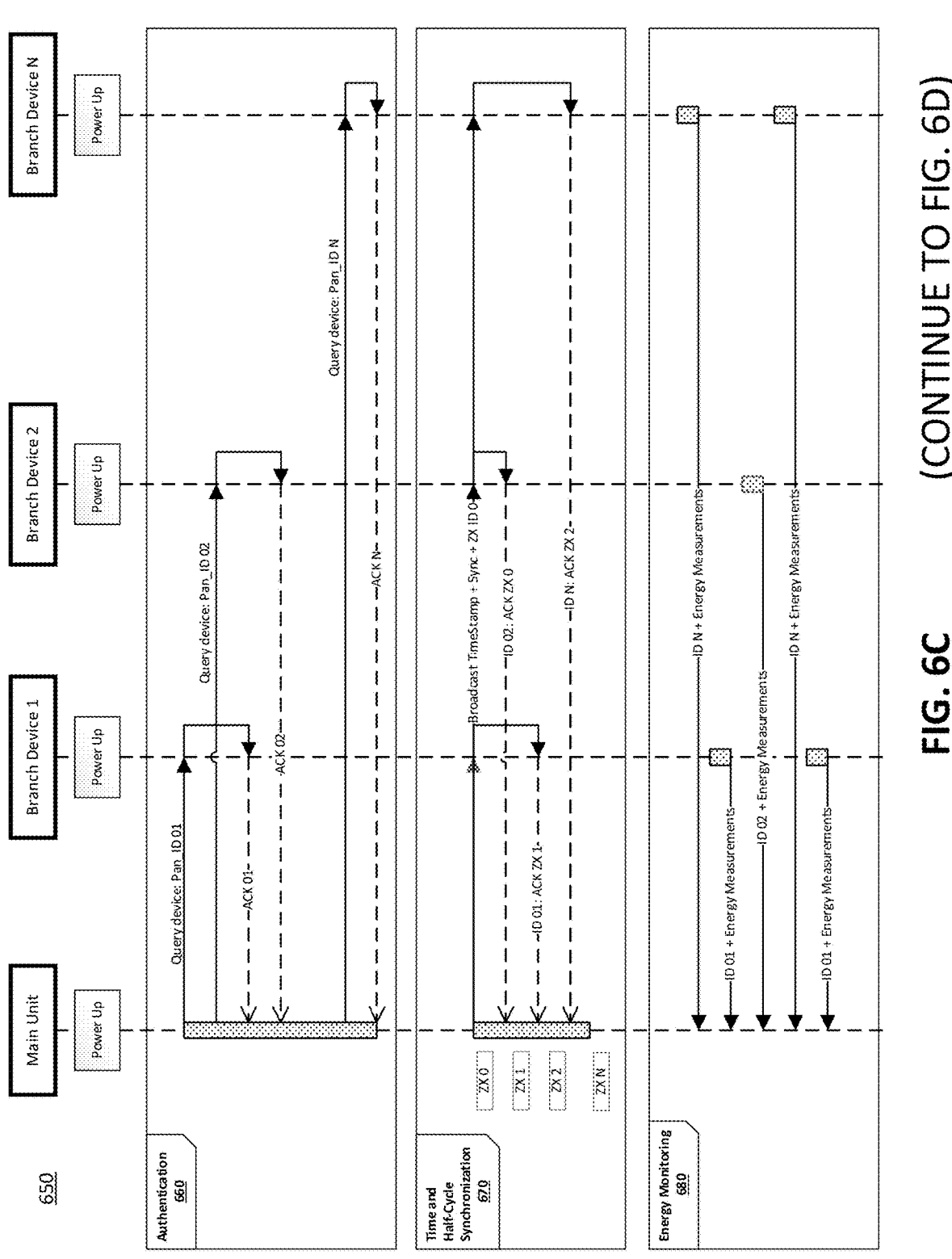
FIG. 6C    (CONTINUE TO FIG. 6D)

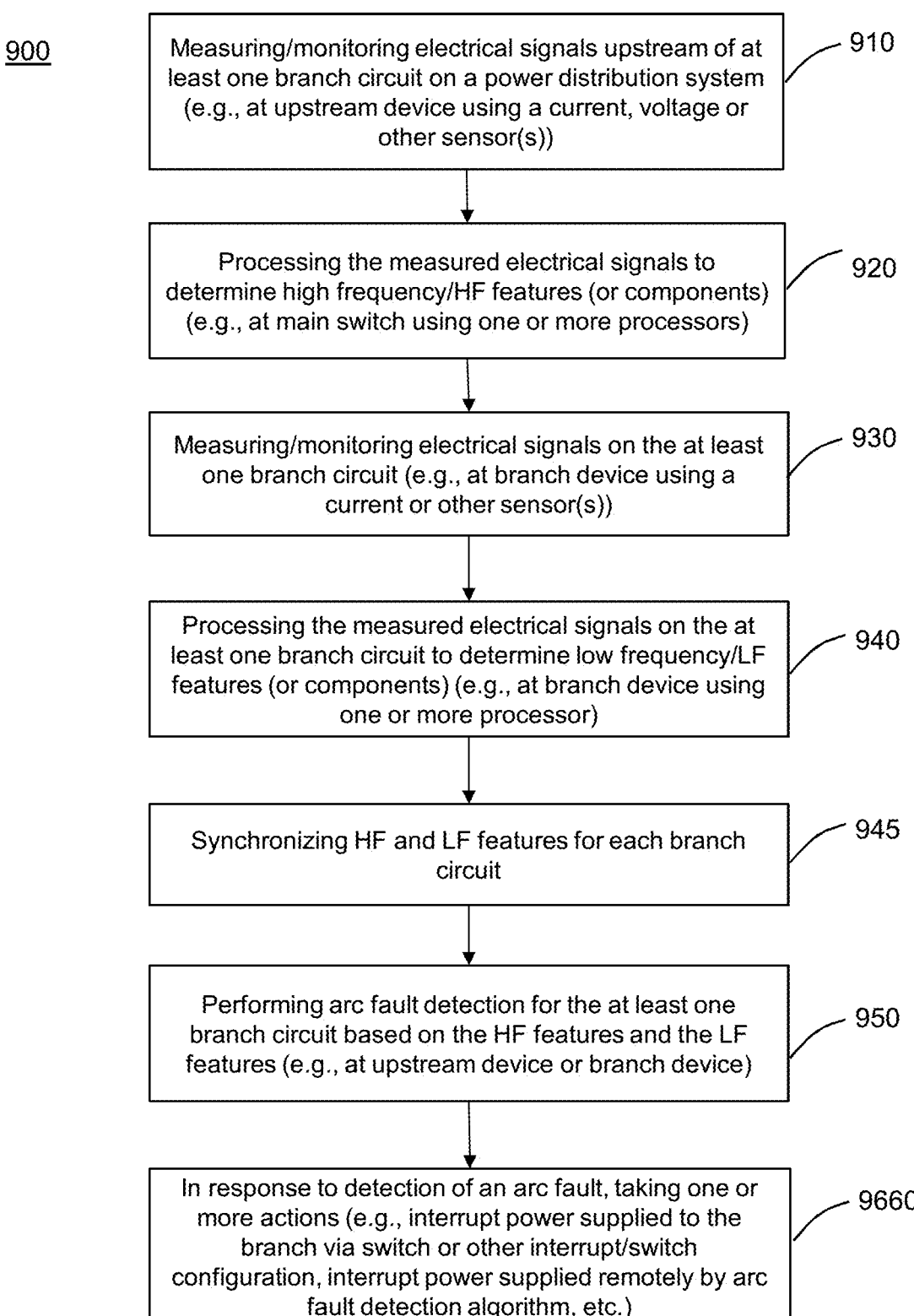

900

Measuring/monitoring electrical signals upstream of at least one branch circuit on a power distribution system (e.g., at upstream device using a current, voltage or other sensor(s)) — 910

Processing the measured electrical signals to determine high frequency/HF features (or components) (e.g., at main switch using one or more processors) — 920

Measuring/monitoring electrical signals on the at least one branch circuit (e.g., at branch device using a current or other sensor(s)) — 930

Processing the measured electrical signals on the at least one branch circuit to determine low frequency/LF features (or components) (e.g., at branch device using one or more processor) — 940

Synchronizing HF and LF features for each branch circuit — 945

Performing arc fault detection for the at least one branch circuit based on the HF features and the LF features (e.g., at upstream device or branch device) — 950

In response to detection of an arc fault, taking one or more actions (e.g., interrupt power supplied to the branch via switch or other interrupt/switch configuration, interrupt power supplied remotely by arc fault detection algorithm, etc.) — 9660

FIG. 9

Fault Downstream of a Branch Device

1000

1010

MPU

1020

C&C

1030A

1030B

1030C

1030D

LOAD

FIG. 10

Fault Upstream of a Branch Device

1100

1110

MPU

1120

C&C 1130-1

Load 1

1130-3

Load 3

1130-N

Load N

FIG. 11

CENTRALIZED FAULT DETECTION WITH FAULT RECOVERY SYSTEM AND METHOD

The present application claims priority to U.S. Provisional Patent Application Ser. No. 63/431,439, filed Dec. 9, 2022. The disclosure of the above-identified prior U.S. Patent Application, in its entirety, is considered as being part of the present application, and thus, is incorporated herein by reference in its entirety.

FIELD

The present disclosure is generally directed to fault detection, and more specifically to centralized arc fault detection in an electrical system.

BACKGROUND

An existing AFCI device(s) (e.g., Circuit Interrupters, Breakers, or Wiring Devices) is self-contained for AF (Arc Fault) detection. Such a device can provide independent protection for each branch which can allow a load center to provide full or partial protection in a home. The cost of the device (s) has increased over the years to include AF sensors, AFE (Active Front End) components and more processing power to handle many signal processing functions. As a result, the device(s) requires more power and is more expensive to manufacture.

With the added complexity of remote controlling such a device, each branch can also contain some communication means with a main processing unit which can control which loads and/or branches are to be power ON or OFF. These mechanical components can further increase the cost and the complexity of the device(s).

SUMMARY

In accordance with an embodiment, a method and system are provided to facilitate arc fault detection on an electrical system. The method and system involve: providing high frequency features determined from high frequency signals, on a circuit monitored by a first sensor of the electrical system, which is measured or obtained by a first device configured to conduct communications with a first remote device(s), the first remote device(s) including a branch device(s) on a branch circuit(s) which is downstream of the monitored circuit. The method and system also involve providing low frequency features determined from low frequency signals, on the branch circuit(s) monitored by a second sensor(s), which is measured or obtain by the branch device(s). The method and system further involve detecting an occurrence of an arc fault on the branch circuit(s) based on the high frequency features and the low frequency features. In various embodiments, in the method and system, the providing high frequency features operation, the providing low frequency operation, and the detecting an occurrence of an arc fault operation are performed by either the first device (e.g., main or central unit or device) or the branch device(s). In some embodiments, the first device can determine the high frequency features for each phase or power line of the electrical system.

In various embodiments, the first device can be located inside or outside of an electrical panel. The branch device(s) can comprises a circuit breaker, a relay, switching device, a wiring device, a lighting switch or control device, or an electrical device connected on the associated branch circuit(s).

In various embodiments, the method and system can further involve communicating energy measurements between the first device and the branch device(s) associated with the branch circuit(s). The energy measurements can include one of the high frequency features of the monitored circuit or information from which the high frequency features are derivable, or the low frequency features of the branch circuit(s) or information from which the low frequency features are derivable. The first device or the branch device(s) can detect for an occurrence of an arc fault on the branch circuit(s) based on the high frequency features and the low frequency features of the branch circuit(s).

In various embodiments, the branch device(s) can include a plurality of branch devices associated with the branch circuits, and the energy measurements can be communicated between the first device and each of the plurality of branch devices.

In various embodiments, the method and system can further involve time synchronizing and half-cycle synchronizing the first device and the branch device(s) to enable exchange of synchronized information, including the energy measurements, between the first device and the branch device(s). The high frequency features for the monitored circuit can be synchronized with the low frequency features for the branch circuit(s). The synchronized high and low frequency features can be used to detect for an occurrence of an arc fault on the branch circuit(s). Furthermore, in some embodiments, the first device can detect for an arc fault on the branch circuit(s), and remotely control the branch device(s) associated with the branch circuit(s) for which an arc fault is detected to de-energize the branch circuit(s).

In various embodiments, the method and system can further involve: measuring or obtaining measurements of, at the first device, the high frequency signals on the circuit monitored by the first sensor, the first device including a first memory, first processor(s) and first communication device for conducting communications with the first remote device(s); measuring or obtaining measurements of, at the branch device(s), low frequency signals on an associated branch circuit(s) monitored by the second sensor(s), the branch device(s) including a second memory, second processor(s) and second communication device for conducting communications with a remote device(s) including the first device; and determining, at the at least one branch device, low frequency features from the measured low frequency signals on the branch circuit(s), the low frequency features being used along with the high frequency features by the first device or by the branch device(s) to detect for an occurrence of an arc fault on the branch circuit(s).

In a further embodiment, the method and system can further involve transmitting a message from the branch device(s) to the first device if the branch device(s) determines that the low frequency features for the branch circuit(s) crosses or satisfies a low frequency threshold(s). In response to receipt of the message, the high frequency features can be communicated from the first device to the branch device(s). The branch device(s) can detect for an arc fault on the branch circuit(s) based on the high frequency features and the low frequency features for the branch circuit(s), and can de-energize the branch circuit(s) associated therewith if an arc fault is detected on the branch circuit(s).

In yet another embodiment, the method and system can further involve transmitting a message from the first device to the branch device(s) if the high frequency features crosses or satisfies a high frequency threshold at the first device. In response to receipt of the message, the low frequency features can be communicated from the branch device(s) to the first device if the low frequency features of an associated branch circuit(s) crosses or satisfies a low frequency threshold(s). The first device can detect for an arc fault on the branch circuit(s) based on the high frequency features and the low frequency features for the branch circuit(s). The branch circuit(s) can be de-energized via the branch device(s) associated therewith if an arc fault is detected on the branch circuit(s) by the first device. Furthermore, in some embodiments, the first device can remotely control the branch device(s) to de-energize the branch circuit(s) if an arc fault is detected on the branch circuit(s).

In various embodiments, the method and system can further involve energizing the branch circuit(s), after expiry of a predetermined disconnection period of time that was initiated in response to a detected arc fault on the branch circuit(s) which resulted in the branch circuit(s) being de-energized by the branch device(s).

In accordance with another embodiment, a method and system are provide for facilitating arc fault detection on an electrical system with a plurality of branch devices on different branch circuits. The method and system involve measuring or obtaining measurements of, at each of the plurality of branch devices, low frequency signals on a respective branch circuit monitored by a respective sensor on the electrical system. Each of the plurality of branch devices includes a memory, a processor(s) and a communication device for conducting communications with a remote device(s) including a first device. The method and system can further determine, at each of the plurality of branch devices, low frequency features from the measured low frequency signals on the respective branch circuit. Energy measurements can be communicated between each of the plurality of branch devices with the first device which is configured to common high frequency features from high frequency signals monitored on a circuit upstream of the branch circuits on the electrical system. The energy measurements includes one of the low frequency features or the common high frequency features. The low frequency features for the respective branch circuit are used along with the common high frequency features to detect for an arc fault on the respective branch circuit.

In accordance with another embodiment, a method and system are provided for load or branch circuit recovery from a fault(s) on an electrical system. The method and system involve maintaining and updating, via or under control of a processor(s), a number of times an attempt has been made to energize a branch circuit(s) after the branch circuit(s) has been de-energized in response to a detected arc fault on the branch circuit(s). The method and system further involve if the number of times of attempts to energize/re-energize the branch circuit(s) satisfies or crosses an attempt threshold, preventing or delaying, via or under control of a processor(s), energization/re-energization of the branch circuit(s) and notifying a user of a hazardous condition associated with the branch circuit(s) or devices thereon.

In accordance with a further embodiment, a method and system are provided for facilitating arc fault detection on a power distribution system having at least one branch circuit. The method and system can involve measuring electrical signals on the power distribution system, via at least one sensor of an upstream device which is connected upstream of the at least one branch circuit with a branch device; and determining high frequency features, from the measured electrical signals via a processor of the upstream device, the determined high frequency features being used by the upstream device or by the branch device to detect for an occurrence of an arc fault on the at least one branch circuit.

In various embodiments, the upstream device can comprise a main switch or breaker of a load center, and the branch device can comprise a circuit interrupter, circuit breaker, wiring device or a circuit protective device for a branch circuit.

In various embodiments, the information of the determined high frequency features or information of a detected occurrence of an arc fault on the at least one branch circuit can be communicated to the branch device of the at least one branch circuit.

In various embodiments, the method and system can further involve measuring electrical signals on the at least one branch circuit, via a sensor associated with the branch device of the at least one branch circuit; and determining low frequency features from the measured electrical signals on the at least one branch circuit. The occurrence of an arc fault can be detected based on at least the determined high frequency features and the determined low frequency features.

In various embodiments, the method and system can further involve: receiving, at the branch circuit device of the at least one branch circuit, the information of the determined high frequency features; synchronizing the determined high frequency features and the determined low frequency features; and detecting for an occurrence of an arc fault on the at least one branch circuit based on the synchronized determined high frequency features and low frequency features. Furthermore, in various embodiments, a branch device on each of a plurality of branch circuits can measure electrical signals and determine low frequency features accordingly, and detect for an arc fault on a respective branch circuit according to the determined high frequency features from the upstream device and respective determined low frequency features.

In various embodiments, the method and system can further involve: receiving, at the upstream device, the information of the determined low frequency features from the branch device; and synchronizing the determined high frequency features and the determined low frequency features; and detecting for an occurrence of an arc fault on the at least one branch circuit based on the synchronized determined high frequency features and low frequency features. Furthermore, in various embodiments, the upstream device can receive information of determined low frequency features from a branch device of a respective branch circuit from a plurality of downstream branch circuits, and detect for an arc fault on a respective branch circuit based on the determined high frequency features from the upstream device and determined low frequency features from a respective branch device of the respective branch circuit.

In accordance with an embodiment, a method can be provided to facilitate arc fault detection on a power distribution system including an upstream device and at least one downstream device on a branch circuit which is downstream from the upstream device. The method and system can involve extracting high frequency features from line current sensor or line voltage sensor in the upstream device; extracting low frequency features or samples from line current sensor or line voltage sensor in the at least one downstream device; and performing arc fault detection for the branch circuit based on the high frequency features and the low frequency features or samples.

In accordance with an embodiment, a system can be provided for facilitating arc fault detection on a power distribution system including an upstream device and at least one downstream device on a branch circuit, which is downstream from the upstream device. The system can include the upstream device for extracting high frequency features from line current sensor or line voltage sensor of the upstream device; and the at least one downstream device for extracting low frequency features or samples from line current sensor or line voltage sensor of the downstream device. Arc fault detection for the branch circuit can be performed by the upstream device or the downstream device based on the high frequency features and the low frequency features or samples.

In various embodiment, a non-transitory computer medium is provided which can store computer executable code, which when executed by one or more processors of an upstream device, is configured to implement the method(s) as described herein.

In an embodiment, a method and system are provided for load or branch circuit recovery from a fault(s) on an electrical system. The method and system can involve: energizing, at a branch device, a branch circuit after expiry of a predetermined disconnection period of time that was initiated in response to a detected arc fault on the branch circuit; updating, using one or more computer processors, a data value representing a number of times an attempt has been made to energize the branch circuit in response to detected arc faults on the branch circuit; and upon determining that the data value satisfies or crosses an attempt threshold, preventing or delaying at the branch device the energizing of the branch circuit.

In various embodiments, the method and system can further involve: upon determining that the data value satisfies or crosses an attempt threshold, notifying a user of a hazardous condition associated with the branch circuit or device(s) thereon.

In various embodiment, the method and system can further involve: detecting, at the branch device or at a central monitoring device on behalf of the branch device, an arc fault on the branch circuit, the branch device being a branch device from a plurality of branch devices on the branch circuit, and de-energizing, at the branch device, the branch circuit in response to the detected arc fault on the branch circuit. Furthermore, the predetermined disconnection period of time for the branch device is of an adequate duration to allow any other branch device, which is downstream from the branch device, to perform detection and de-energization operations for the arc fault before the branch device attempts to energize the branch circuit.

In various embodiment, a de-energization or trip response time for performing de-energization or tripping operation at the branch device to de-energize the branch circuit can be based on at least a size of or current being drawn by a load(s) connected to the branch circuit via the branch device. The method and system can further involve: determining a de-energization or trip response time for the branch device to de-energize the branch circuit based on at least a size of or current being drawn by a load(s) connected to the branch device. Furthermore, the determining a de-energization or trip response time can determine the de-energization or trip response time for the branch device based on at least a size of a load(s) connected to the branch devices relative to a size of or current being drawn by a load(s) connected to other branch devices on the branch circuit. The de-energization or trip response time for each of the branch devices on the branch circuit can be less or faster for a larger load(s), or can be greater or slower for a smaller load(s) relative to other branch devices on the branch circuit.

In various embodiment, the method and system can further involve: detecting a relative location of the detected arc fault along the branch circuit based on a detected presence or absence of an arc fault by other branch devices on the branch circuit; and allowing the branch devices upstream of the detected location of the arc fault to remain energized on the branch circuit or to re-energize the branch circuit.

In various embodiments, the method and system can further involve: de-energizing the entire branch circuit if two or more branch devices from the plurality of branch devices on the branch circuit detect an arc fault on the branch circuit; and; and notifying a user of a hazardous condition associated with the branch circuit or branch devices thereon.

In various embodiments, the energizing operation, updating operation, and preventing or delaying operation are performed by the branch device. Furthermore, the branch circuit includes a plurality of branch devices including the branch device, and each of the branch devices is configured to perform the energizing operation, updating operation, and preventing or delaying operation.

In various embodiments, the branch circuit can include a plurality of branch devices including the branch device. Each of the branch devices can be configured to perform the energizing operation, and a central monitoring device in communication with and control of the branch devices can be configured to perform or control the updating operation, and the preventing or delaying operation.

In various embodiments, the branch circuit is one of a plurality of branch circuits, with each of the branch circuits including a plurality of branch devices. The method and system can further involve: coordinating, via a central monitoring device in communication with and control of each of the branch devices on the branch circuits, a performance or control of the energizing operation, the updating operation, and the preventing or delaying operation. Furthermore, the branch devices on the branch circuits can include circuit breakers, which are maintained in a load center. The central monitoring device can be located inside or outside of the load center.

In various embodiments, the branch device can be a circuit protective device on the branch circuit.

In various embodiment, a non-transitory computer medium is provided which can store computer executable code, which when executed by one or more processors of an upstream device, is configured to implement the method(s) as described herein.

It is to be understood that both the foregoing general description and the following detailed description are exemplary and explanatory only and are not restrictive of the invention, as disclosed or claimed. The claims should be entitled to their full breadth of scope, including equivalents.

DESCRIPTION OF THE FIGURES

The description of the various example embodiments is explained in conjunction with the appended drawings.

FIG. 6A and FIG. 6B show a diagram of example data flow showing the coordination of information between the main processing unit and the branch devices for a configuration of a protection system, in accordance with an embodiment of the present disclosure.

FIG. 6C and FIG. 6D show a diagram of example data flow showing the coordination between the main processing unit and the branch devices for a configuration of a protection system, in accordance with an embodiment of the present disclosure.

FIG. 9 illustrates a flow chart of an example process of performing arc fault detection for one or more branch circuits using HF features (or components) determined upstream of the one or more branch circuits or their branch devices, in accordance with an embodiment of the present disclosure.

FIG. 10 illustrates a fault scenario with a fault downstream of a branch device, in accordance with an embodiment.

FIG. 11 illustrates a fault scenario with a fault upstream of a branch device, in accordance with an embodiment.

DISCUSSION OF EXAMPLE EMBODIMENTS

Figure 1:
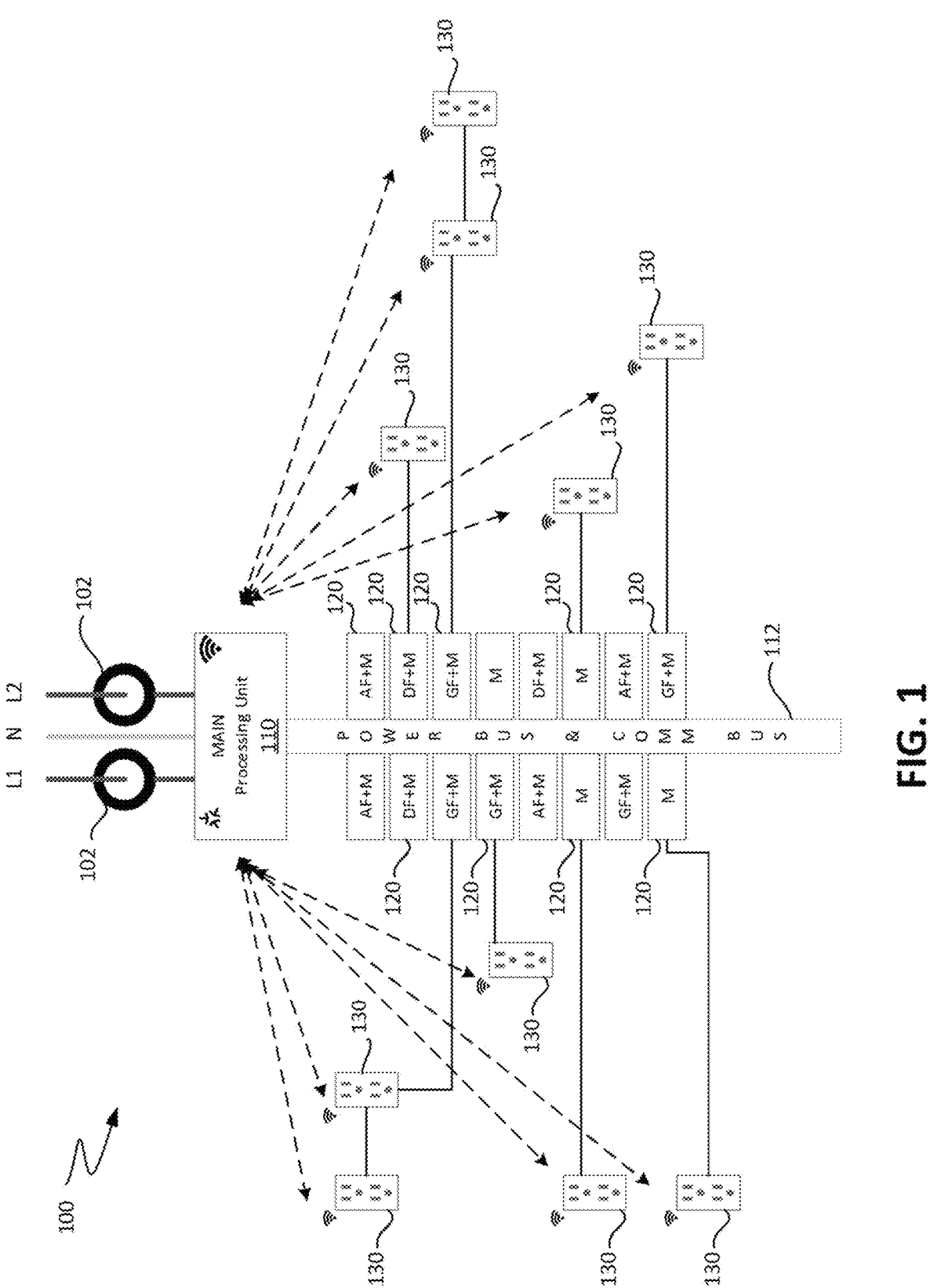
FIG. 1 is a diagram of an example protection system (for a power distribution system,) showing a main processing unit (MPU) and branch devices including circuit breakers, metering devices, wiring devices and other devices, in accordance with an embodiment of the present disclosure.

An arc fault detection (AFD) method and system are provided for detecting an occurrence of an arc fault (AF) on one or more branch circuits (or branch circuit(s)) of an electrical system such as a power distribution system. For example, an arc detection method and system can detect for an occurrence (or non-occurrence) of an arc fault on a branch circuit(s) based on for example high frequency (HF) features (or components) and low frequency (LF) features (or components) monitored on the branch circuit(s) of the power distribution system. The types of features (or components) to be determined from high and low frequency energy-related signal samples monitored on the electrical system using sensors can depend on the fault detection algorithm, and may include by way of example zero crossing, broadband noise, randomness of current variation and/or other well-known features employed for arc fault detection. Instead of determining (e.g., determining, computing, calculating, deriving, extracting, etc.) both the HF and LF features on a branch device(s) of respective branch circuit(s), the HF features can be determined externally from the branch device(s), such as by a main processing unit (MPU). The external HF can be used along with low frequency features monitored on a branch circuit(s) to detect for an occurrence of an arc fault on the branch circuit(s) (or lines or phases thereof) by the MPU, or the branch device(s). In response to detection of an arc fault on the branch circuit(s), an action(s) can be taken. These actions can include de-energizing the branch circuit(s), such as by interrupting power supplied to the branch circuit or its load(s) (e.g., implementing a tripping or switching operation via the branch device(s), etc.), notifying a user or central monitoring system of the condition, performing additional analysis, turning off load(s) on the branch circuit(s) or performing other action(s) to address the detected condition on the electrical system.

A "branch device", as used herein, can include a circuit breaker, a metering device, a relay, a switching device or switch, a wiring device, branch circuit device, and other electrical device(s) connected on or downstream of a branch circuit. A "wiring device", as used herein, can include an electrical device(s), which can serve as a connection or control point for an electrical circuit, such as for example electrical outlet(s) or receptacle(s), switch(es), light switch or other lighting control device, and so forth. A main processing unit (also referred to as "MPU") can be an intelligent or smart device, which can be implemented through a Main switch or breaker in an electrical panel (e.g., load center, panel board, etc.), or can be implemented outside of an electrical panel. The MPU and branch devices, as well as other devices described herein, can communicate using wireline communication, wireless communication or a combination thereof.

The AFD method and system of the present disclosure can provide various benefit(s)/advantage(s). For example, because arc-fault (AF) detection employs HF sensing to detect arc-fault energy, the method and system described herein can offer a simplified solution to AF detection by making the HF component common to all branch devices for each phase or power line. This can remove the need to have AF or HF AFE (Analog Front End) components on each branch device and can reduce the burden on the processing unit of the branch device to process AF or HF signals. Furthermore, HF features are computationally more intensive than the LF features collected for low frequency signals. Because each branch circuit or its associated branch device(s) also measures LF signals for metering application(s), the sensor and the hardware circuit can be tuned for low frequency current measurement with better accuracy while keeping the processing unit simple with reduced memory, processing speed and power consumption.

Furthermore, having the HF and LF features spread out between the MPU and the branch devices can allow for a system and method that can be smart and coordinated with home devices and that is not limited to implementation on circuit breakers or other devices inside an electrical panel. In cases of potential nuisance trip(s), the system and method also can allow for recovery from a potential nuisance trip(s) and can reduce the impact a potential nuisance trip(s) may have on the customer (e.g., a user) or customer equipment/load(s) while still providing protection for the customer's home.

In various embodiments, the AF detection can be performed by the MPU for at least one branch circuit, or by the branch device(s) on the branch circuit(s). For example, the HF features or information thereof can be communicated/exchanged from the MPU to the branch device(s) to enable arc fault detection to be performed on the branch device(s). Alternatively, the LF features or information thereof can be communicated/exchanged from the branch device(s) to the MPU to enable AF detection to be performed by the MPU. In either example cases, the HF and LF features can be synchronized to perform AF detection. The synchronization can include time and half-cycle synchronization between the MPU and the branch devices to synchronize information, such as energy-related measurements and other information for AF detection, which is exchanged between the MPU and each of the branch devices.

In various embodiments, the HF features and LF features can employ filtering and/or other signal processing techniques to determine HF and LF features. The HF features and LF features are provided as input to an AF detection state machine, algorithm, or process to detect an occurrence (or not) of an arc fault on a circuit, such as a branch or other circuit.

In various embodiments, a branch circuit can include or comprise branch circuit(s) and/or one or more wiring devices.

In various embodiments, wiring device(s) can pertain to remote control (RC) wiring device(s), which can contain some communication for energy monitoring as well as opening and closing a circuit(s). In various embodiments, the RC wiring devices may not necessarily take the form of "breaker" devices, as they can be switching devices. In various embodiments, a breaker device(s) can provide some additional protection, such as thermal and magnetic protection for overloads or short-circuits. The wiring device(s) can be mainly a switch, which can be controlled remotely to open or close the load connected to it.

In various embodiments, the system and method can implement a recovery process to energize/re-energize a branch circuit(s), which has been de-energized in response to detection of an arc fault on the branch circuit(s), after a time out period. The system and method can notify a customer after the branch circuit(s) has been energized/re-energized a predetermined number of times to warn the customer of a potential hazardous electrical condition on the branch device, branch circuit or load connected to the branch circuit.

These and other exemplary AFD methods and systems and features associated therewith of the present disclosure will be described herein in detail below with reference to the figures.

In the context of AF detection, a high frequency (HF) signal that is created during an arc fault in a particular branch is broadband and can be sensed and measured by each AF protection device connected in that branch. The HF signals are low enough, however, that the analog-front-end (AFE) for each branch device such as for example an AFCI device can have a gain of more than 50 (dB) which is a significant amplification to see any high frequency generated from any branch. Each AFCI device can make its own decision on whether to trip or not based on its own AFD algorithm and LF signals it detects. In accordance with various embodiments, a centralized or coordinated arc fault detection method and system are provided with a common HF processing unit for branch devices such as branch circuit breakers and/or wiring devices, etc. Such an approach can reduce the components that each AF protection device is utilizing for detecting HF content and computing its features.

For example, some branch devices, which provide for AF detection, employ a current sensor that is tuned for both HF and LF signals. The sensor design can require some tradeoff between accuracy of low frequency currents over the sensitivity of the high frequency current. Such a current sensor may require a lower winding count to reduce the winding capacitance; however, a smaller number of turns does not provide a good reading for LF current. Therefore, by removing the requirement for HF sensing, the sensor of a branch device can be improved for accuracy on LF currents, which can improve metering measurements over temperature, frequency range and load capacity.

Furthermore, because the HF signals is not processed locally such as at each branch device, the processing units of these branch devices can have a significant reduction in memory and calculations which can help in reducing power consumption and lowering the cost of the microcontroller.

Since each branch device may be required to have a communication channel, the metering can be available on all of them, and thus, the LF sensor, AFE and processing software are available; however, the configuration for AF can be switchable via software. Once the branch device is configured for AF detection, then the main control unit can provide the processed HF features to these branch devices which can then use it on their own algorithm along with LF features and decide whether to trip on AF or not.

The AFD algorithm (also referred to as process or method) can, for example, include two sets of inputs, e.g., HF features and LF features. The AFD state machine allows the decision to be made based on these two sets of data and their previous states. Because HF features can be computed outside the branch device, the AFD algorithms can require an abstraction of these two sets of inputs so that external data can be supplied and synchronized with LF features computed internally. Without the HF Features, the AFD algorithm can ignore the LF features for AF detection but use them for Metering and Energy Monitoring.

The configuration of each branch device can be selected based on the Electrical Code Requirements at the time. However, there might be branches that may not be configured for additional AF protection. These branches can detect, and instead of interrupting the circuit, they can notify the user of a potential AF and trigger a service request for investigation for a fault, bad appliance, or non-compliant load. At any point, if the branch is showing continuous signs of potential AF, a software (SW) switch configuration upgrade of AFD may be recommended or enabled for an additional cost. There will be no requirement to replace the branch device.

FIG. 1 is a diagram of an example protection system for an electrical system such as a power distribution system, in accordance with embodiment. As shown in FIG. 1, the protection system can include a main processing unit (MPU) 110, a plurality of branch devices 120, 130 and a bus system 112. In this example, the MPU 110 can be a Main switch or Main circuit breaker, which receives power lines from an upstream power supply. The power lines can include a plurality of electrical conductors, which can include a Line 1 (L1), Line 2 (L2) and Neutral (N).

The bus system 112 can include communication buses and power buses. The communication buses can be connected between the MPU 110 and the branch devices 120 to enable communication therebetween. The power buses can be connected between MPU 110 and the branch devices 120 to enable the distribution of electrical power received at MPU 110, (e.g., a Main switch or circuit breaker) from the power lines to the branch circuit devices 120 and their associated branch circuit circuits. As further shown, the branch circuits can further distribute electrical power to other branch devices 120, such as for example wiring devices or other electrical devices connected thereto.

The MPU 110 can include processor(s) and a switch or a trip unit (or the like) for selectively connecting or disconnecting the branch devices 120, 130 from the power lines. The MPU 110 can include (or have associated therewith) logic and processing components such as sensors (e.g., current sensor(s), voltage sensor(s), etc.), high frequency (HF) sensor(s), digital signal processing (DSP) components (e.g., analog front end (AFE) and A/D converter(s), etc.) and communication channels (e.g., wired and/or wireless) for high-speed communication with the branch devices 120, 130. An example of sensor(s), such as current sensors, are shown by reference 102, which can measure current signals on L1 and L2.

Each branch device 120 can be communicatively connected to the MPU 110 across the communication bus of the system bus 112, and electrically connected to Phase 1 (e.g., L1) or Phase 2 (e.g., L2) and Neutral (N) bus across the power bus of the system bus 112. Each branch circuit device 120 can be configured to implement one or more functions, such as Metering (M), Ground Fault (GF) protection, Arc Fault (AF) protection, both AF and GF (also referred to as "dual function" or DF) protection, or a combination thereof. Metering can be available in each branch circuit device 220, but GF and AF detection capability can be selectable based on the Electrical Code requirements and branch application (including load(s)). The functionality of a branch device 120 (e.g., M, AF+M, GF+M, DF+M. etc.) can be configured according to the electrical requirements of the associated branch.

Each branch device 130 can be communicatively connected to the MPU 110 via wireless communication, and electrically connected on a branch circuit downstream of a branch device 120. In this example, the branch device 130 can be a wiring device, such as an electrical outlet or receptacle, which can have a load connected thereto (e.g., customer equipment).

In this example, the MPU 110 also can be configured to provide other protection functions for short circuits and coordination with each branch device 120, 130 for load management such as demand response and other faults, diagnostics, and identification of load, etc. The MPU 110 can establish communication with each branch device 120, 130 (e.g., breaker(s), wiring device(s), etc.) connected further downstream on the power distribution system.

For AF detection, there are no extra components that are required on the branch devices. The AF detection can be enabled via a software configuration setting which can allow a branch device 120, 130 to receive and process HF features from MPU 110. In an another embodiment, the branch devices 120, 130 can transmit to the MPU 110 energy measurements, such as low frequency features or associated information, monitored for their associated branch circuit. The MPU 110 can perform the AF detection for the branch circuits, and take appropriate action in the event of AF detection on a branch circuit. For example, the MPU 110 can remotely control the branch device associated with any branch circuits for which an arc fault has been detected or take other actions as described herein in the event a fault is detected. The above are provided as examples in which arc fault detection and protection can be coordinated between the MPU 110 and a branch device 120, 130. The MPU 110 and 120, 130 can be configured to coordinate the arc fault detection for one or more branch circuits according to the various example approaches described herein. In various embodiments, the MPU 110 can be configured to selectively enable AF detection and/or protection for the branch circuit(s) (or selective ones) through or under control of the MPU 110, or through or under control of the branch device(s) according to a user selection(s)/command(s), predetermined schedule(s) or predetermined condition(s) on the electrical system, MPU 110, branch device(s) 120, 130, home or facility, and/or other condition(s).

GF detection also can be available on each branch device 120, 130, but can be selectively enabled or disabled based on the Code Requirements for different power distribution networks or network applications. with an embodiment of the present disclosure.

Figure 2A:
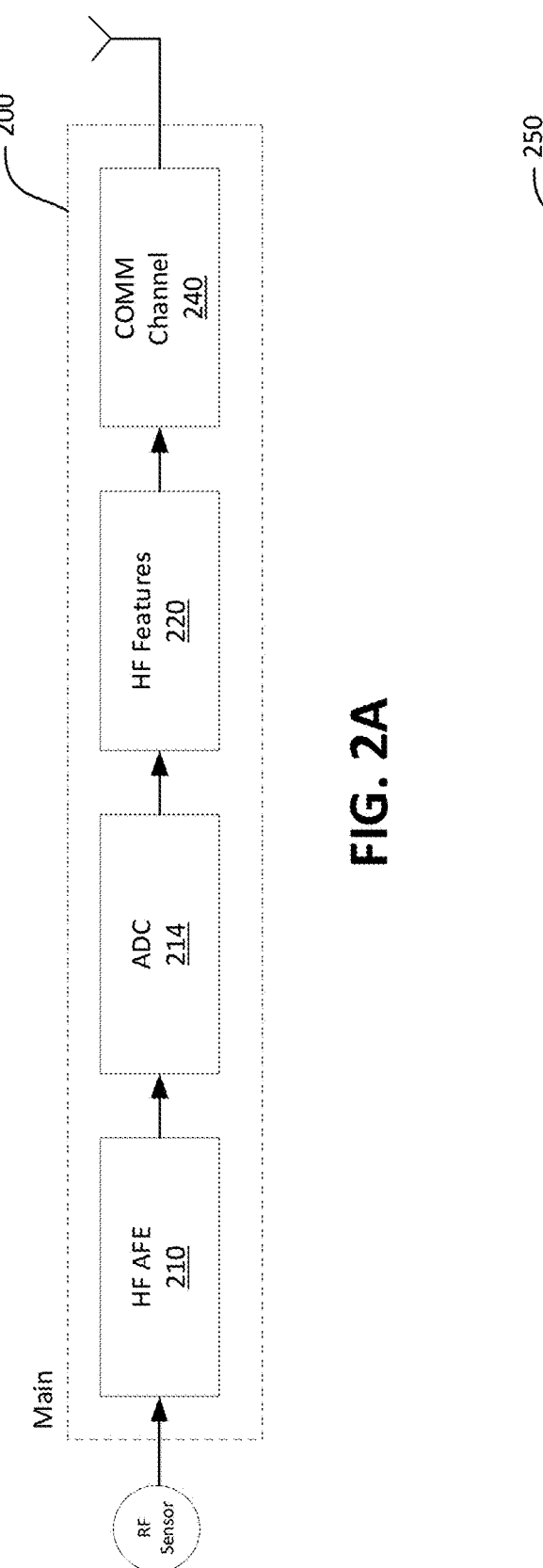
FIG. 2A illustrates a functional block diagram of an example main processing unit, in accordance with an embodiment of the present disclosure.

FIG. 2A illustrates a functional block diagram of an example main processing unit or MPU 200, in accordance with an embodiment of the present disclosure. The MPU 200 can include a high frequency (HF) analog front end (AFE) 210, an analog-to-digital converter (ADC) 214, HF features 220 and communication channel 240.

The HF AFE 210 can receive HF signals outputted from a radio frequency (RF) sensor, such as a HF current, voltage or power sensor, which can monitor (or measure) energy/electrical signals in a desired HF range on a circuit of the electrical system. The HF AFE 210 can perform signal conditioning on the high frequency (1F) signals from the sensor. The HF AFE 210 can include analog amplifiers, op amps, filters, integrated circuits and/or other components for signal conditioning.

The ADC 214 can convert the analog HF signals to digital HF signals (or measurement samples thereof).

The HF features 220 can be determined (e.g., determined, calculated, computed, derived, extracted, etc.) from the HF signals. The type of HF features can be dependent on the AFD algorithm, which is employed.

The communication channel 240 can enable the MPU 200 to communicate/exchange information with remote device(s), including the branch device(s), via wireline and/or wireless communications. For example, the MPU 200 can communicate information for use in arc fault detection as well as protection. In one example, the MPU 200 can broadcast or transmit HF features, HF signals, information derived from HF features or signals (e.g., potential or preliminary arc fault detection) and other information described herein to one or more branch devices to facilitate arc fault detection, either at the MPU 200 or a branch device(s). The MPU 200 can also transmit or receive other information, which may be relevant to the operation of the MPU or its functions, the status of the power distribution system (including the monitored circuit(s)) such as event data including fault or fault-related event data, acknowledgement messages (e.g., ACK, NACK, etc.) or other messages, synchronization information, etc.

Figure 2B:
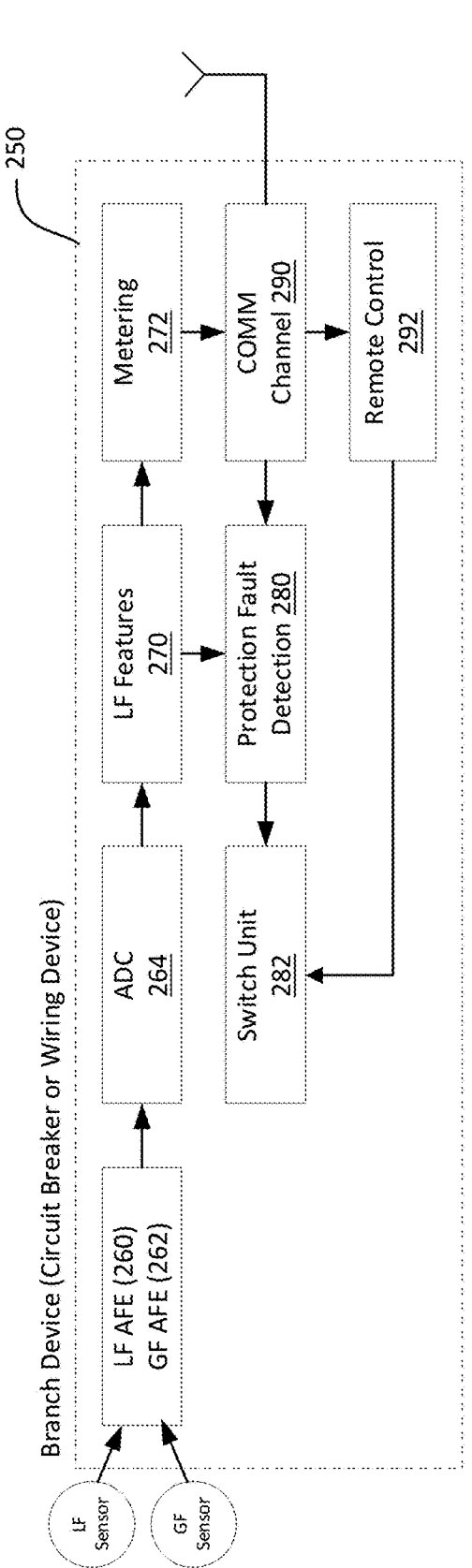
FIG. 2B illustrates a functional block diagram of an example branch device, in accordance with a further embodiment of the present disclosure.

FIG. 2B illustrates a functional block diagram of an example branch device 250, in accordance with an embodiment of the present disclosure. The branch device 250 can include low frequency (LF) analog front end (AFE) 260, a ground fault (GF) analog front end (AFE), an analog-to-digital converter (ADC) 264, LF features 270, metering 272. Protection fault detection 280, switch unit 282, communication channel 290 and remote control 292.

The LF AFE 260 can receive LF signals outputted from a LF sensor, such as a LF current, voltage or power sensor, which can monitor (or measure) energy/electrical signals in a desired LF range on a circuit, such as a branch circuit, of the electrical system. The LF AFE 260 can perform signal conditioning on the LF signals from the LF sensor. The LF AFE 260 can include analog amplifiers, op amps, filters, integrated circuits and/or other components for signal conditioning.

The GF AFE 262 can receive signals outputted from a GF sensor, such as a GF current sensor, which can for example monitor (or measure) all current carrying conductors (including the return path) on a phase of a circuit, such as a branch circuit, of the power distribution system. The outputted signal from the GF sensor can reflect a presence or absence of leakage current on the monitored circuit. As would be understood by those skilled in the art, a ground fault may be present when the current through the current carrying conductors (including the return path) is not equal to zero, which can reflect current leakage on the circuit. The GF AFE 262 can perform signal conditioning on the signals from the GF sensor. The GF AFE 262 can include analog amplifiers, op amps, filters, integrated circuits and/or other components for signal conditioning.

The ADC(s) 264 can convert the analog LF and GF signals to digital LF and GF signals (or measurement samples thereof) respectively for further processing. The GF signals can be monitored to determine a ground fault condition on the monitored circuit.

The LF features 270 can be determined (e.g., determined, calculated, computed, derived, extracted, etc.) from the LF signals. The type of LF features can be dependent on the AFD algorithm, which is employed.

The communication channel 290 enables the communication, including transmission, broadcast or receipt, of information with other devices, including the MPU and if desired other branch device(s) on the same branch circuit, a parallel branch circuit(s), or other branch circuit(s), via wireline or wireless communications. For example, the branch device can communicate information for use in arc fault detection as well as protection. In one example, the branch device 250 can broadcast or transmit LF features, LF signals, information derived from LF features or signals (e.g., potential or preliminary fault detection) and other information described herein to the MPU to facilitate arc fault detection, either at the MPU or locally at the branch device 250. The branch device 250 can also transmit or receive other information, which may be relevant to the operation of the branch device or its functions, the status of the power distribution system (including the monitored circuit(s)) such as event data including fault or fault-related event data, acknowledgement messages (e.g., ACK, NACK, etc.) or other messages, synchronization information, etc.

The Metering 272 can process the LF signals to measure and record electrical parameters of the monitored electrical energy on the monitored circuit, such as for example current, voltage, power, usage and/or other energy-related information derived therefrom. The metered information from the Metering 272 can be communicated, via the communication channel 290, to a remote device (e.g., user device, monitoring system, home automation system, etc.) for reporting, further analysis, or further action.

The protection fault detection 280 can perform various fault detection, including but not limited to GF fault detection from GF signals obtained from the GF sensor, AF detection using LF and HF features, or other operations described herein for fault detection (including arc fault detection) and protection. As described herein, the HF features may be provided by a centralized system such as the MPU, which may be synchronized with the LF features monitored by the branch device 250, such as time and half-cycle synchronized. Alternatively, the branch device 250 may transmit the LF features 270 for the monitored branch circuit to the MPU so the MPU can detect for an AF on the monitored branch circuit.

The switch unit 282 may be a switch or trip unit/device, which can be operated to energize or de-energize a branch circuit by connecting or disconnecting respectively the branch circuit from an upstream power supply. In various embodiments, the switch unit 282 can be controlled to de-energize the branch circuit in response to detection of a fault, e.g., arc fault or ground fault or other fault condition, by the protection fault detection 280. The switch unit 282 also can be remotely controlled by a remote device, such as the MPU, which can transmit a control message or signal which is received by the Remote Control 292 via the communication channel 290 of the branch device 250. The Remote Control 292 can thereafter control the switch unit 282 to energize or de-energize the branch circuit according to the control message or signal.

For example, the MPU can remotely control the branch device 250 to de-energize the branch circuit associated therewith when the MPU detects an arc fault on the branch circuit. Furthermore, the MPU or the branch device 250 also can energize/re-energize the branch device 250 via the switch unit 282 as part of a recovery process after a fault is no longer present (or detected) on the branch circuit. The switch unit 282 also can be locally controlled by the branch device 250 or remotely controlled by a remote device (including but not limited to the MPU), as part of a home automation system and method to control energy usage on the branch circuit and loads connected thereto.

Figure 3:
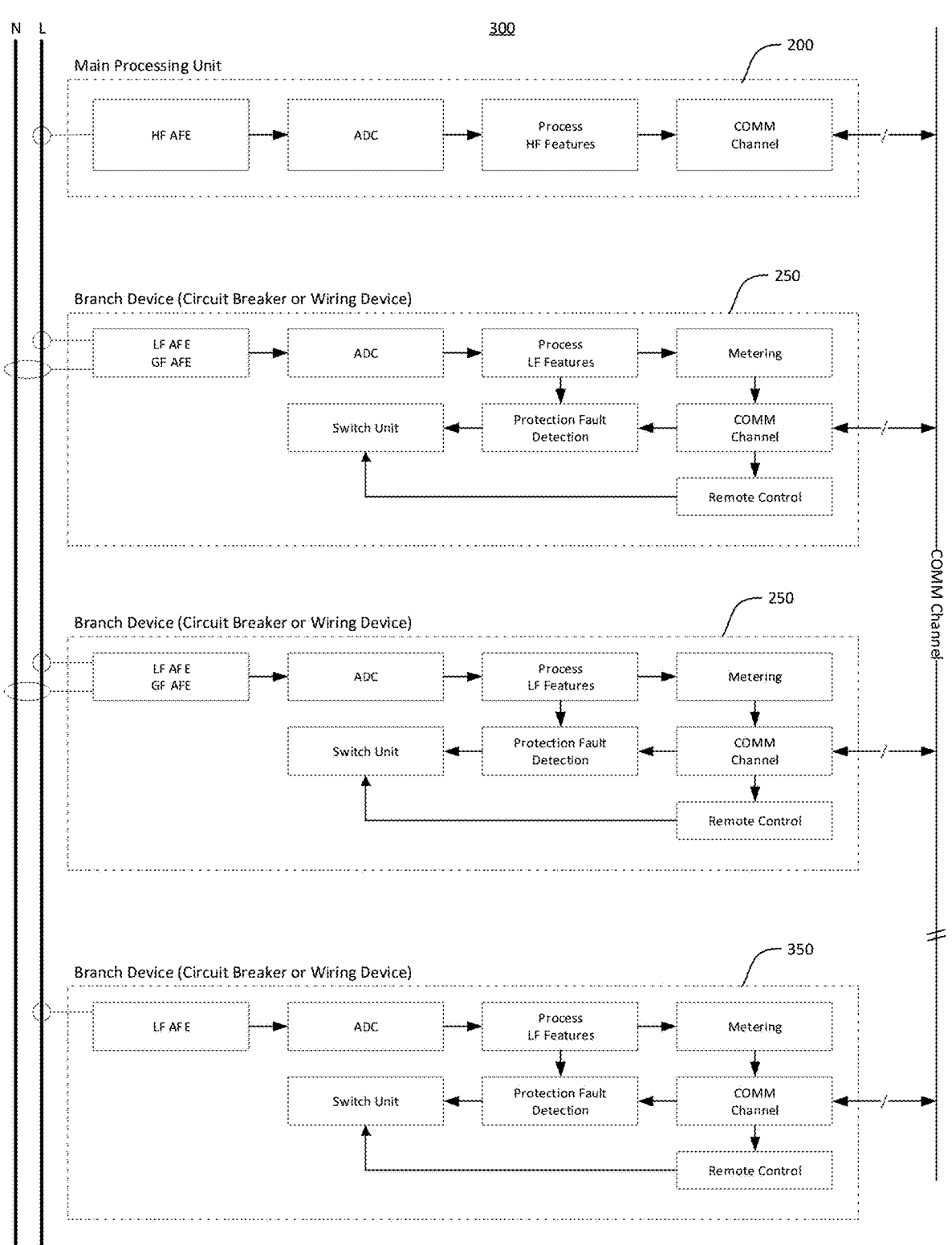
FIG. 3 illustrates a diagram of an example wiring configuration/topology of a protection system including a main processing unit and branch device(s), in accordance with a further embodiment of the present disclosure.

FIG. 3 illustrates a diagram of an example wiring configuration/topology 300 of a protection system including a main processing unit and branch devices, in accordance with a further embodiment of the present disclosure. In this example, the protection system can include a main processing unit (MPU) 200 which can be the same or similar as the MPU shown and described with reference to FIG. 2A. The protection system also can include a plurality of branch devices 250 which can be the same or similar to the branch device shown and described with reference to FIG. 2B, and a branch device 350. As shown in FIG. 3, the MPU 200 can communicate by exchanging information with the branch devices 250, 350 to coordinate arc fault detection and protection, such as described herein. The measurements from the sensors can be received using wireline or wireless communication.

The MPU 200 can receive output HF signals from an RF/HF sensor, which is monitoring Line conductor L of the circuit of the electrical system. In this example, the MPU can be connected upstream of the branch devices 250, 350 on the power distribution system such as in an electrical panel, or can be connected outside of an electrical and receive measurements of HF signal from the HF/RF sensor, which is upstream of the branch circuits associated with branch devices 250, 350.

The branch device(s) 250 can receive output GF signals from a GF sensor which monitors both the Line conductor L and Neutral conductor N (return path) on the branch circuit of the power distribution system, and output LF signals from an LF sensor which monitors the Line conductor L on the associated branch circuit of the electrical system. In this example, the branch circuit(s) and LF and GF sensors are downstream of the circuit monitored by the RF/HF sensor.

The branch device 350 is similar to the branch device 250, except that the branch device 350 does not include GF detection capability and components associated therewith. For example, the branch device 350 can perform metering of desired electrical parameters for the energy monitored on the Line conductor L of the associated branch circuit using an LF sensor. The branch device 350 also can coordinate with the MPU to perform arc fault detection and protection as described herein.

Figure 4A:
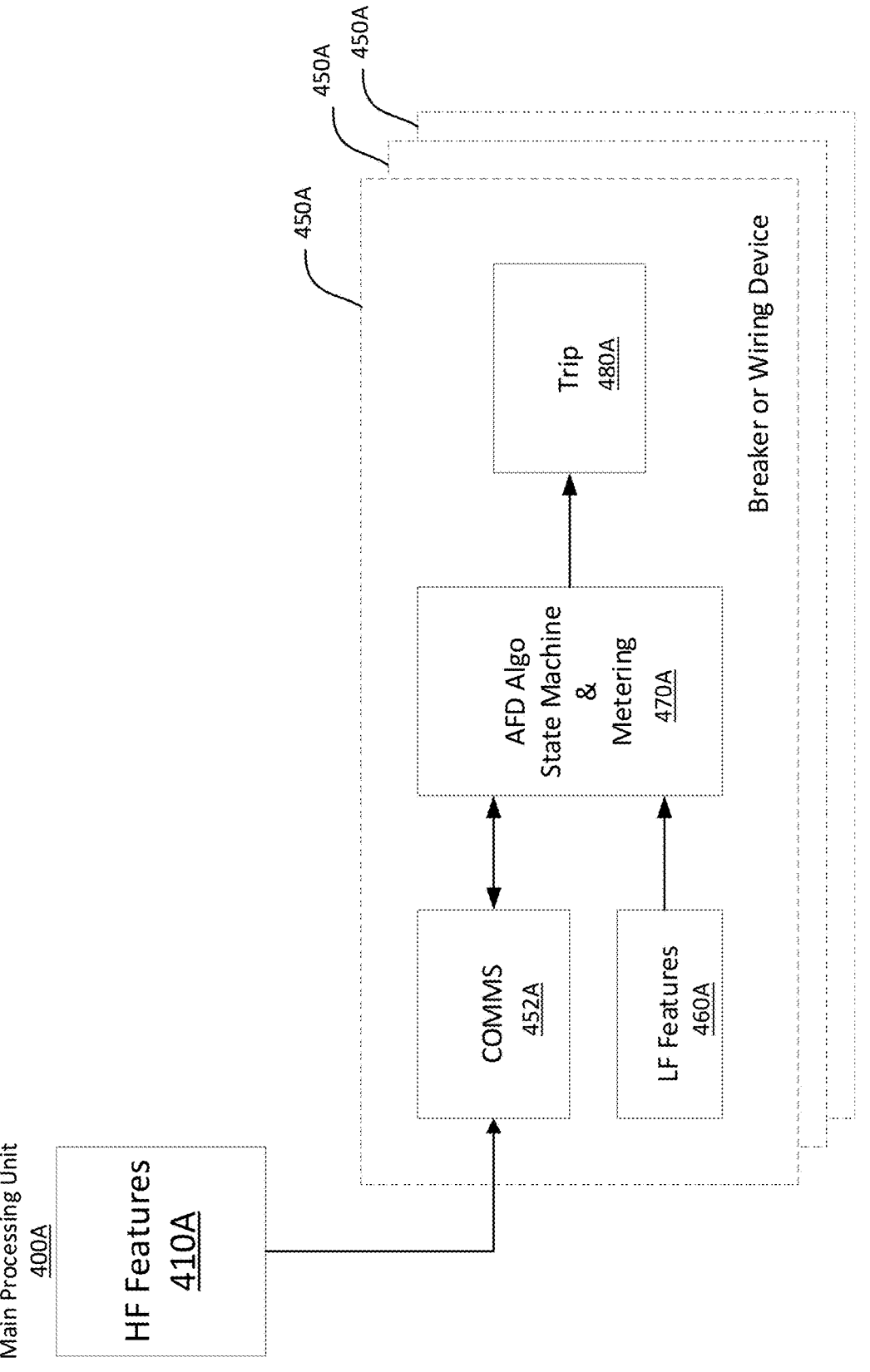
FIG. 4A illustrates a functional block diagram of an example configuration for a protection system and process thereof in which arc fault detection (AFD) is performed by a branch device, in accordance with an embodiment of the present disclosure.

FIG. 4A illustrates a functional block diagram of an example configuration for a protection system and process thereof in which arc fault detection is performed by the branch device, in accordance with an embodiment of the present disclosure. As shown in FIG. 4A, there is provided a main processing unit (MPU) 400A and one or more branch devices 450A. The main processing unit 400A can be configured to determine high frequency (HF) features 410A (or components) or information thereof on a monitored electrical circuit of an electrical system, or receive such information from another device. The MPU 400A can transmits (e.g., transmit, communicate, broadcast, etc.) HF features 410A to a plurality of branch devices, such as branch devices 450A for use in performing arc fault detection using external HF features received from the MPU 400A.

In this example, the branch device 450A can be configured to implement various functions and operations for detecting an arc fault condition (or signals) and, if desired, other conditions on the electrical system (e.g., a power distribution system or network). For example, the branch device 450A can be configured to conduct communications (as shown by block 452A) with remote device(s) to transmit and/or receive information across a communication channel, via communication device(s). As shown, the branch device 450A can receive information, such as high frequency (HF) features 410A of the monitored circuit, from a remote device such as the MPU 400A. The MPU 400A can be configured to monitor HF signals on the circuit, and can transmit information about the HF features to one or more branch devices 450A for use in performing AF detection for an associated branch circuit(s). The information from the MPU 410A can be common information which is communicated, e.g., broadcast or transmitted, to a plurality of branch devices 450A on the electrical system, for use in detecting an arc fault condition on their respective branch circuit.

Furthermore, the branch device 450A can be configured to monitor locally low frequency (LF) signals for LF features 460A on the branch circuit. The branch device 450A also can be configured to implement algorithm(s) (or process(es)) to perform arc fault detection and metering (M) as shown by block 470A. The branch device 450A can implement am AFD algorithm to detect for an occurrence (or not) of an arc fault condition based on the externally determined HF features 410A and the locally determined LF features 460A. In various embodiments, the externally determined HF features 410A are synchronized with the locally determined LF features 460A to facilitate arc fault detection.

The branch device 450A also can be configured to control a trip (or tripping) operation, as shown by block 480A, to protect an associated monitored circuit or component(s) connected thereto including load(s). For example, in the event an arc fault condition is detected on the associated branch circuit, the branch circuit device 450A can cause a trip operation to be implemented to interrupt (or turn OFF) a supply of electrical power to the branch or load(s) connected thereto, via a switch, trip unit/device, etc.

Figure 4B:
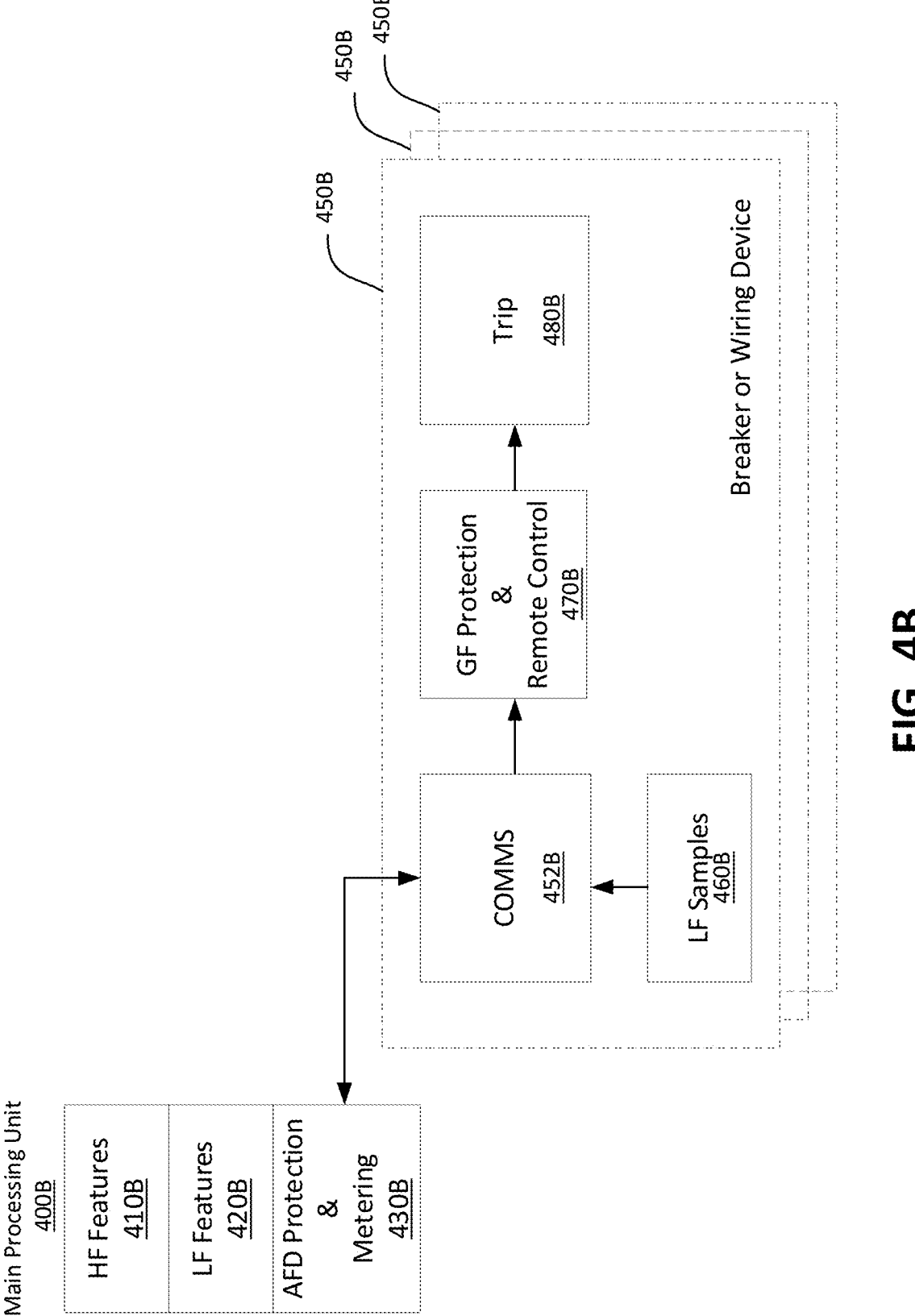
FIG. 4B a functional block diagram of an example configuration for a protection system and process thereof in which arc fault detection (AFD) is performed by a main processing unit, in accordance with an embodiment of the present disclosure.

FIG. 4B illustrates a functional block diagram of an example configuration for a protection system and process thereof in which arc fault detection is performed by the main processing unit or MPU, in accordance with an embodiment of the present disclosure. In this example, a remote device such MPU 400B can interact with a plurality of branch circuit devices 450B, and can be configured to perform determination of HF and LF features, thereby enabling a more simplified configuration for each branch device 450B. For example, each branch device 450B can include a simplified protection and a communication (COMMS) module where it processes LF samples and provides GF protection.

As shown in FIG. 4B, the branch device 450B can be configured to implement various functions and operations for detecting arc fault condition (or signal(s)) and, if desired, other conditions on the electrical system. For example, the branch device 450B can be configured to conduct communications (as shown by block 452B) with remote device(s) to transmit and/or receive information, via communication device(s). As further shown, in this example, the branch device 450B can transmit information, such as LF samples 460B monitored on an associated branch circuit, to a remote device such as the MPU 400B, with signal processing and communication capabilities. The MPU 400B can be configured to monitor HF signals on the circuit to determine HF features 410B or to obtain the HF features from a remote or local device, and to determine LF features 420B from LF samples transmitted by the branch device(s) 450B.

The MPU 400B also can be configured to implement AFD protection and metering 430B based on the HF features 410B and/or LF features 420B. For example, the MPU 400B can be configured to perform arc fault detection based on the HF features 410B and the LF features 420B for the branch circuit associated with the branch device(s) 450B. In the event of arc fault detection on the branch circuit(s), the MPU 400B can transmit a control signal (or command) to the branch device 450B in order to remotely control the branch device(s) 450B to implement a trip operation. Furthermore, the MPU 400B can be configured to perform metering based on the received LF samples 460A or the LF features 420B determined therefrom. In various embodiments, the MPU can interact with a plurality of branch devices 450B and remotely control a trip operation on a selected branch device(s) 450B when the MPU 400B detects an arc fault on a branch circuit(s) associated with the selected branch circuit device(s) 450B.

Furthermore, the branch device 450B can be configured to monitor locally LF signals to obtain LF samples 460B (e.g., LF signal samples) for an associated monitored branch circuit, and to transmit the LF samples via communications 452B to the MPU 400B to perform arc fault detection and/or other operations including but not limited to metering. The branch device 450B also can be configured to implement GF protection and to be remotely controlled, as shown by block 470B. For example, the branch device 450B can detect ground fault (GF) condition based on the monitored LF signals or samples associated therewith or LF features determined therefrom. The branch device 450B also can receive a control signal (or command) from the MPU 400B to control various operations or components of the branch device 450B.

The branch device 450B also can be configured to control a trip (or tripping) operation, as shown by block 480B, to protect the monitored circuit or component(s) connected thereto including load(s). For example, in the event a fault detected, the branch circuit device 450B can cause a trip operation to be implemented to interrupt a supply of electrical power to the circuit, such as a branch circuit, or load(s) connected thereto, via a switch or trip unit/device. In this example, the MPU 400B can transmit a control signal (command) to the branch device 450 when an arc fault is detections on a branch circuit associated with the branch device 450. The branch device 450B receives the control signal from the MPU 400B via communication 452B to perform a trip operation, and can implement a trip operation 480B accordingly to interrupt (or turn OFF) a supply of power to the branch circuit (including components connected thereto such as load(s)) associated with the branch device 450B.

Figure 5A:
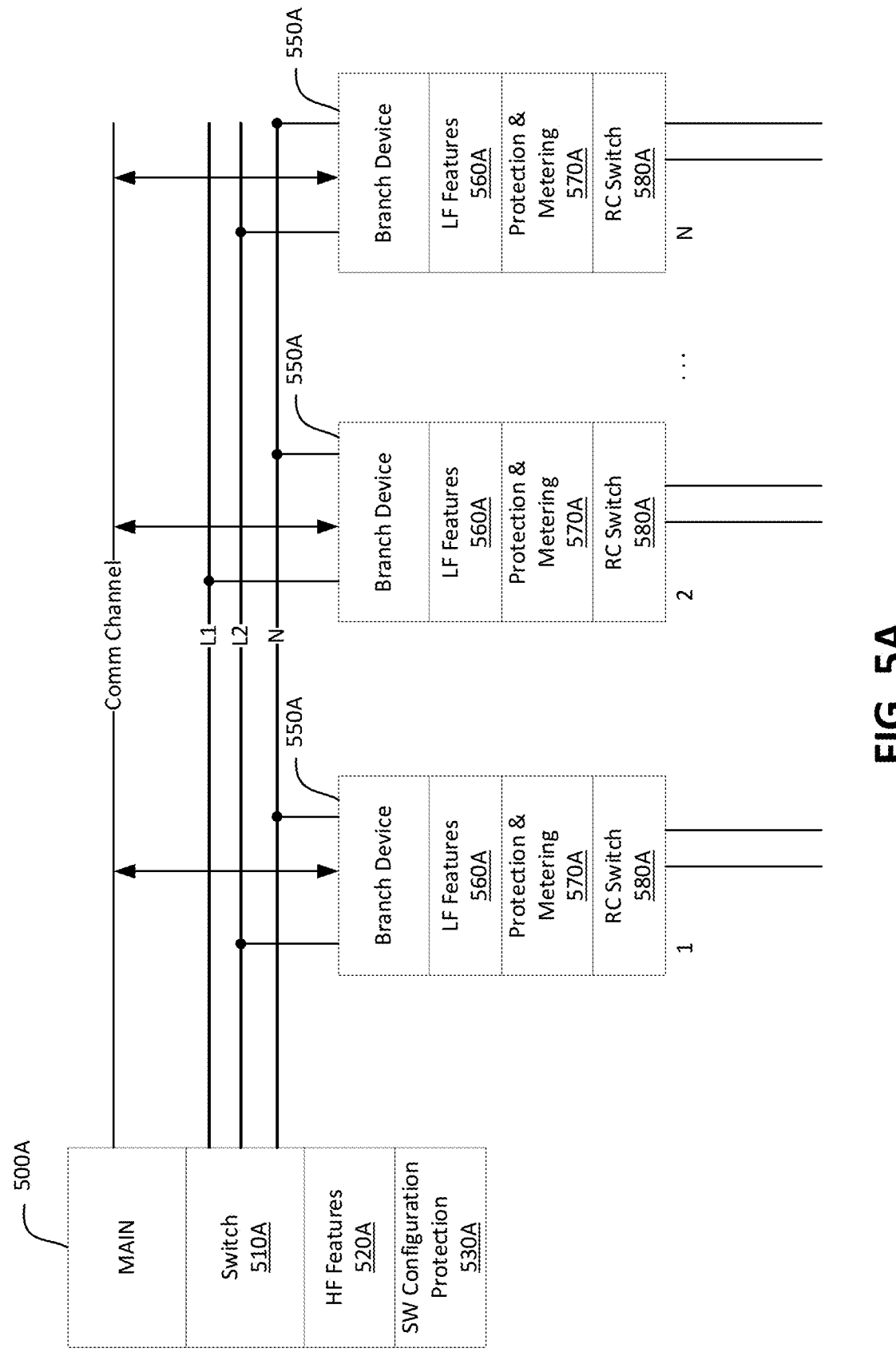
FIG. 5A illustrates a diagram of example components and wiring configuration of a protection system with a main processing unit and branch devices, in accordance with an embodiment of the present disclosure.

FIG. 5A illustrates a diagram of example components and wiring configuration for a protection system, in accordance with an embodiment of the present disclosure. In this example configuration topology, there is a main processing unit (MPU) 500A, and a plurality of branch devices 550A in which external HF features are employed to perform arc fault detection for a branch circuit (or line(s) or phase(s) thereof). Each branch device 550A can be connected to either Line conductor L1 or L2 and to the Neutral conductor N of a power bus system. In this example, the power bus system can be connected upstream to the MPU 500A, which can be a main switch or circuit breaker. The branch devices 550A and the MPU 500A can communicate with each other over a communication channel(s) using wireless and/or wireline communication.

As shown in FIG. 5A, the MPU 500A can include a switch 510A. The MPU 500A can implement various functions and operations, including determination of HF features 520A and implementation of software (SW) configuration protection 530A, by or under control of a processing unit (e.g., one or more processors) of the MPU 500A. The HF features 520A can be determined from HF signals monitored on the circuit by sensor(s) associated with or in communication with the MPU 500A. The SW configuration protection 530A can be configured to implement AF protection for the branch circuit(s) through or under control of the MPU 500A, such as described herein.

Each of the branch devices 550A can include a remote-control (RC) switch 580A. The branch device 550A can implement various functions and operations, including determination of LF features 560A and implementation of protection and metering 570A by or under control of a processing unit (e.g., one or more processors) of the device 550A. The LF features 560A can be determined from LF signals monitored by sensor(s) associated with or in communication with the branch device 550A.

In this example, branch devices 550A are communicatively connected to the MPU 500A which contains the processing unit for the HF feature. In comparison to the example of FIG. 1, the same general topology can be provided, but with a different network channel (e.g., wireless or wired) to facilitate communication between the MPU 500A and branch circuit devices 550A. The MPU 500A can be communicatively connected to each individual branch device and provide HF feature information to the branch devices 550A that are configured to provide for AF protection. In various embodiments, the MPU 500A can broadcast information of HF features or other related information to remote devices including the branch devices 550A. The branch circuit device 550A can be configured to implement an AFD algorithm to detect for an arc fault condition based on the external HF features and the locally determined LF features, and to perform a trip operation via RC switch 580A to interrupt (or turn OFF) a supply of power to its associated branch circuit (including components connected thereto such as load(s)) in the event an arc fault is detected on the branch circuit. The RC switch 580A of each branch device 550A also can be remotely controlled by the MPU 500A to selectively turn ON or OFF a supply of power to its associated branch circuit.

In various embodiments, the HF features can be processed at each Half-Cycle (HC) and can be provided to each branch device 550A within a time window that is sufficient for each branch device 550A to decide for AF protection within the required standard trip times. The received HF features also can be synchronized with the locally determined LF features to facilitate arc fault detection.

Figure 5B:
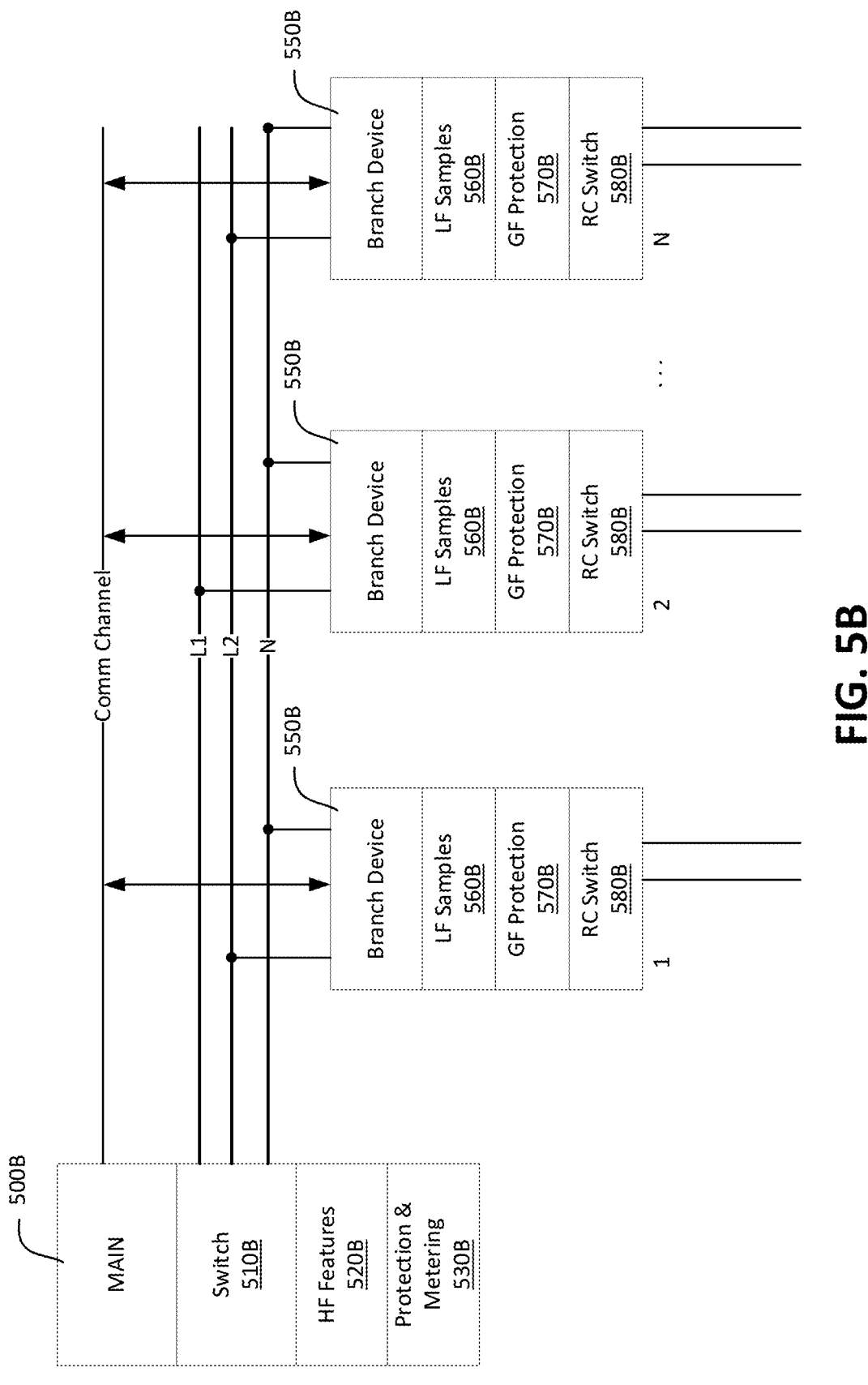
FIG. 5B illustrates a diagram of example components and wiring configuration of a protection system with a main processing unit and branch devices, in accordance with an embodiment of the present disclosure.

FIG. 5B illustrates a diagram of example components and wiring configuration for a protection system, in accordance with an embodiment of the present disclosure. In this example configuration topology, there is a main processing unit (MPU) 500B, and a plurality of branch devices 550B in which external HF features are employed to perform arc fault detection for a branch circuit (or line(s) or phase(s) thereof). The MPU 500B can be a main switch. Each branch device 550B can be connected to either Line conductor L1 or L2 and to the Neutral conductor N of a power bus system. The power bus system may be connected upstream to the MPU 500A, which can be a main switch or breaker. The branch devices 550B and the MPU 500B can communicate with each other over a communication channel(s) using wireless and/or wireline communication.

As shown in FIG. 5B, the MPU 500B can include a switch 510B. The MPU 500B can implement various functions and operations, including determination of HF features 520B and implementation of protection and metering 530B, by or under control of a processing unit (e.g., one or more processors) of the MPU 500B. The HF features 520B can be determined from HF signals monitored on the circuit by sensor(s) associated with or in communication with the MPU 500B.

Each branch device 550B can include a remote-control (RC) switch 580B. The branch device 550B can implement various functions and operations, including determination of LF samples 560B and implementation of GF protection 570B, by or under control of a processing unit (e.g., one or more processors). The LF samples can be obtained from LF signals monitored by sensor(s) associated with or in communication with the branch circuit device 550B, and communicated to the MPU 500B over the communication channel.

In this example, as shown in FIG. 5B, the branch device(s) 550B can sample the LF current (e.g., monitor LF signals using sensor(s)) and packetize them and sends them to the MPU 500B via the communication channel where the MPU 500B can determine the LF features, aggregate them and use them to determine which branch device should be tripped based on AF signals present to mitigate a potential fire hazard. For example, the MPU 500B can implement an AFD algorithm to detect for an arc fault condition (or signals) on each branch circuit based on the HF features and the LF features transmitted by a branch device 550B on or associated with the branch circuit. In the event that an arc fault condition is detected on a specific branch circuit, the MPU 500B can remotely control the branch device 550B associated with the specific branch circuit to perform a trip operation via its RC switch 580B to interrupt (or turn OFF) a supply of power to the branch circuit (including components connected thereto such as load(s)). The RC switch 580B of each branch circuit device 550B also can be remotely controlled by the MPU 500B to selectively turn ON or OFF a supply of power to its associated branch circuit.

In this example, the AFD algorithm is not required to run in each processing unit of the branch circuit devices 550B, thereby reducing the requirements further towards a lower cost processing unit for the branch device. In various embodiments, the received HF features are synchronized with the locally determined LF features to facilitate arc fault detection.

The MPU 500B can also be configured to determine metering information for each branch or the whole system. For example, metering information may be provided based on LF samples or other information received from the branch devices 550B or monitored locally by the MPU 500B.

Figure 6B:
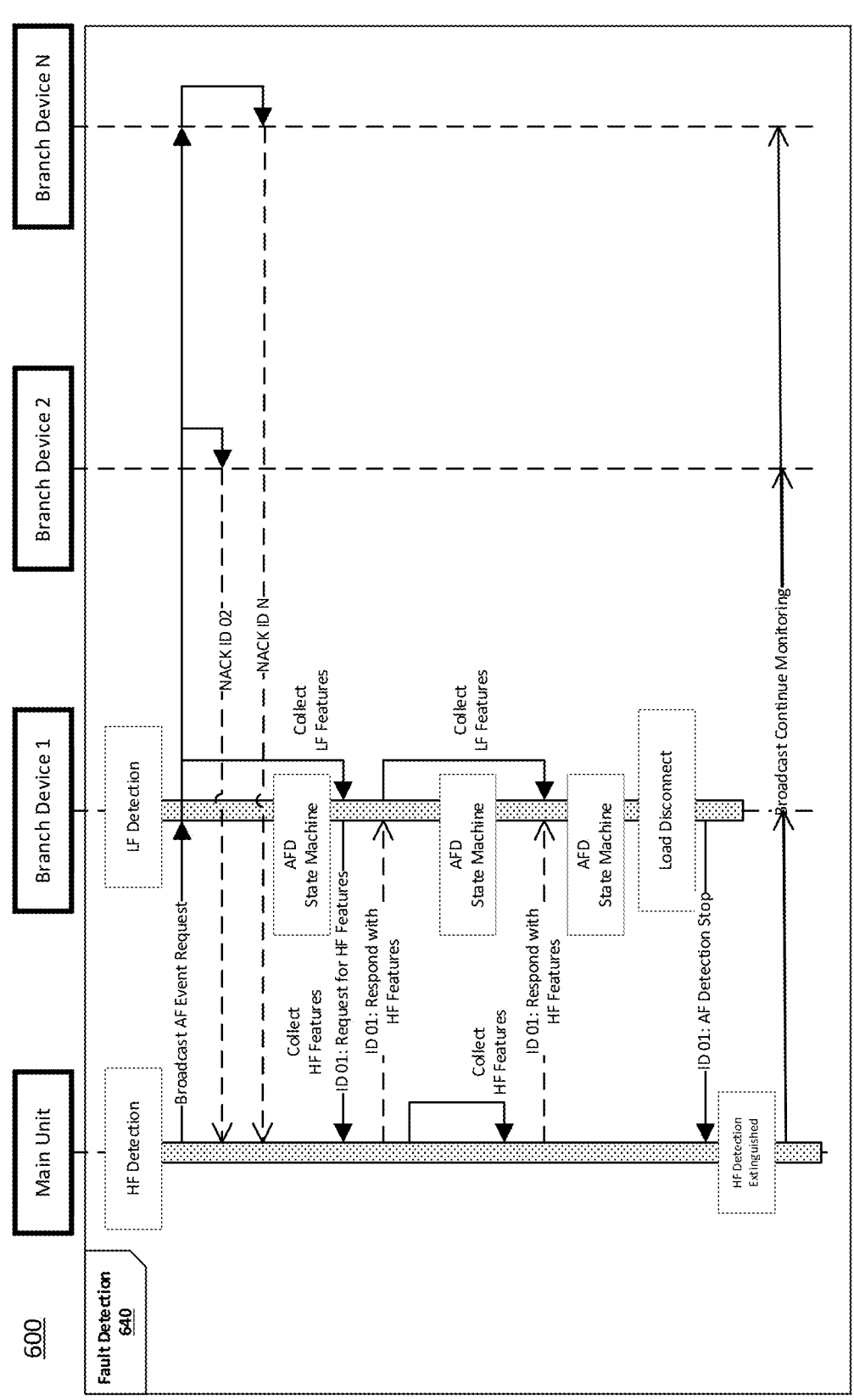

FIG. 6A and FIG. 6B illustrate a diagram of example data flow 600 of the coordination between a main unit and the branch devices for a configuration of a protection system, in accordance with an embodiment of the present disclosure. The main unit can be a main processing unit (or MPU) such as described herein. In FIG. 6A and FIG. 6B, the MPU and the plurality of Branch Devices can interact to perform various processes or protocols such as Authentication process at block 610, Time and Half-Cycle Synchronization process at block 620, Energy Monitoring process at block 630 and Fault Detection process at block 640. For the purposes of discussion, the data flow 600 of FIG. 6A and FIG. 6B will be described below with reference to the main processing unit or MPU and Branch Device(s) (e.g., 1 . . . N).

In the Authentication process of block 610, the MPU can have a list of all the devices that have been registered during the commissioning process by the installer or during the installation of devices. Upon power up, each Branch Device can be queried (e.g., Query Device: Pan_ID01, ID02, . . . ID0 N) by the MPU and authentication process with exchanges of keys and acknowledge messages (e.g., ACK 01, ACK 02, . . . ACK 0 N) validates that all devices are present and up and running. Anyone acknowledged in the field can implement different authentication schemes to ensure that no rogue or fake devices are present in the local network.

Once the authentication process of block 610 is completed, a time synchronization process can proceed at block 620. For example, in the Time and Half-Cycle Synchronization process at block 620, it is important that each Branch Device is in-sync with the MPU. This can guarantee that each data, which is reported or exchanged between the MPU and Branch Devices, is well correlated to facilitate the Arc Fault Detection (AFD) algorithm or process thereof. The time synchronization can take advantage of a Simple Precision Time Synchronization algorithm, such as IEEE 1588.2008 or other proprietary ones. The precise time synchronization allows each branch device to have the same internal clocks to perform synchronized acquisition of signals. Because each Branch Device is connected with the MPU and is within the same network, the number of network hops between these devices and the MPU can be minimal. Besides synchronization of clocks with each Branch Device, a Zero-Cross number can be exchanged as well. Since all devices (e.g., the MPU and the Branch Devices) are connected in the same AC power line, they can all see the same voltage Zero-Crosses that can be used to synchronize their respective ACK (Acknowledge) messages with respect to the zero-cross value. Once all the Branch Devices are synchronized with the MPU and they respond with the correct Zero-Cross id/count, the time synchronization process at block 620 is completed, and each device can report measurement data or other data (which may need a frame of reference such as time between devices) to the MPU with the Zero-Cross value. If any of the Branch Devices reports measurement data with a different zero-cross value, the MPU can initiate a time synchronization process with that specific device instead of with all the devices.

Next, at the Energy Monitoring process at block 630, each Branch Device, after it has been synchronized with the MPU, can follow a Round-Robin scheduler to report their energy measurement as configured (e.g., Active Power, Power Factor, etc.) by the installer at a desired rate. This processing loop example does not require the MPU to query the Branch Devices, but it can acknowledge their reported values and check their Zero-Cross ID for any desynchronization that could occur over time, which in this case it can initiate a time synchronization process with that device.

As further shown in FIG. 6B, in the Fault Detection process at block 640, once the MPU detects any High Frequency (HF) event from its High Frequency features, it needs to know which Branch Device is seeing the fault as well. In this example case, the Branch Devices can only monitor the low frequency (LF) measurements and potential perturbations that are caused by a load transition or potential arc fault due to impedance changes with the load from a broken wire or cabling. Both the MPU and the Branch Devices can process these features for every half-cycle. Therefore, once the high frequency features pass a predetermined threshold for that half-cycle or a number of half-cycles, a broadcast message (e.g., Arc Fault Event) is sent out to all Branch Devices to report LF features that might have crossed a predetermined threshold as well. If a Branch Device does not see any changes in the LF features, then the device can respond with a NACK (see, e.g., Branch Devices 2 and N) in FIG. 6B).

There are various ways to implement when a branch device sees that LF features crossed a threshold. In a first example, the Arc Fault State machine (or process thereof) can reside or be implemented in the Branch Device and request from the MPU the HF Features and make the decision itself. For example, if a Branch Device sees that LF feature crossed a threshold, then the Branch Device can request the MPU to report HF features and upon receiving of these measurements (see, e.g., Branch Device 1 in FIG. 6B). The Branch Device can run the AFD state machine to determine whether there is an Arc Fault or not. The MPU can continue to process HF frequency features and periodically send them to the Branch Device which can process them in the AFD state machine to make the decision to disconnect the load or not. Once the Branch Device determines that there is a hazardous fault, the Branch Device can disconnect (e.g., Load Disconnect) the branch circuit or the load and notify the MPU that the fault detection and mitigation occurred (e.g., ID 01: AF Detection Stop). The MPU can make a request to all the Branch Devices to resume the report on Energy Monitoring (see, e.g., Broadcast Continue Monitoring). Another example of a fault detection process is described below with reference to FIG. 6D.

Figure 6D:
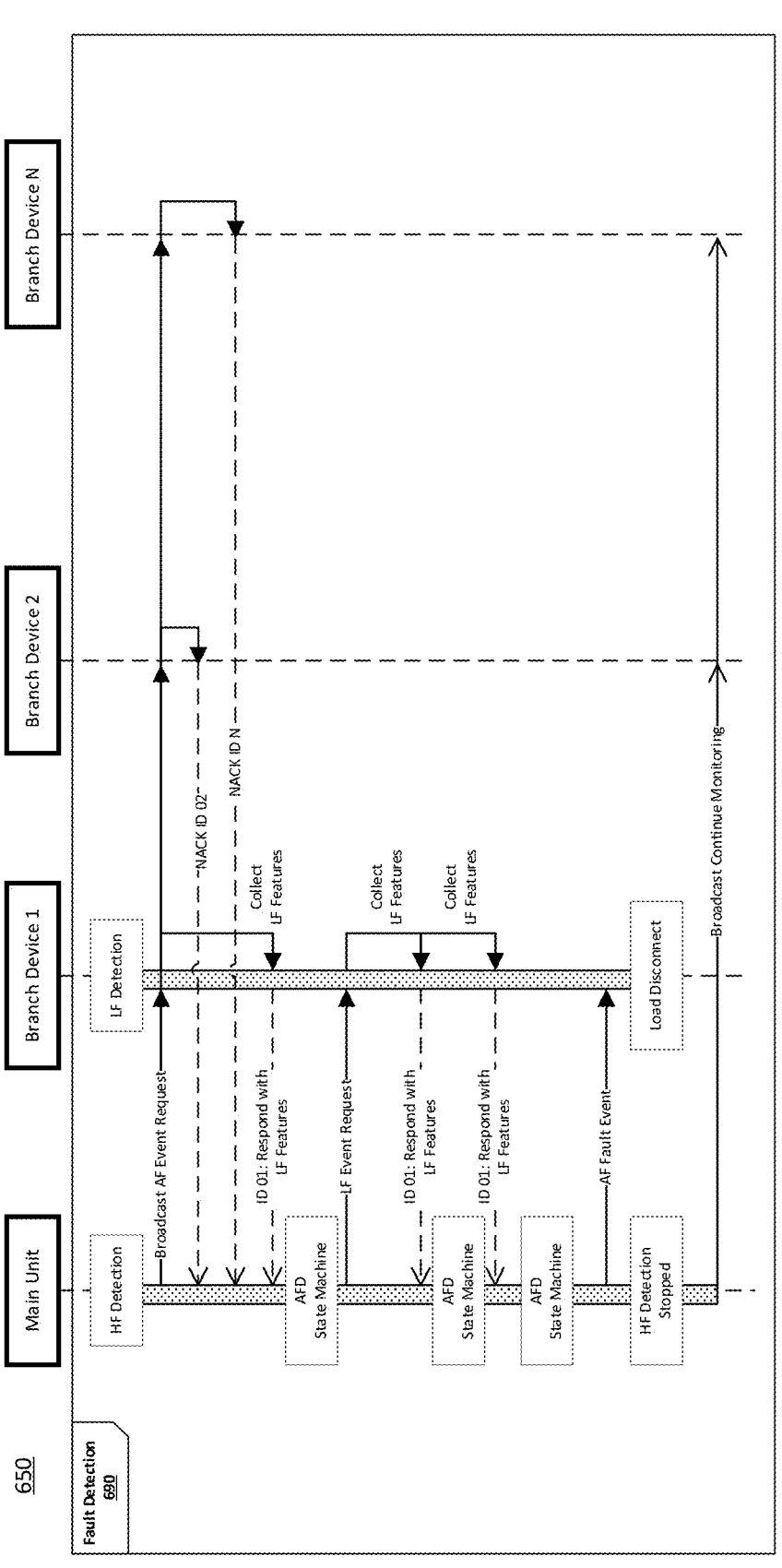

FIG. 6C and FIG. 6D illustrate a diagram of example data flow 650 of the coordination between a main unit and branch devices for a configuration of a protection system, in accordance with an embodiment of the present disclosure. The main unit can be a main processing unit (or MPU) such as described herein. In FIG. 6C and FIG. 6D, the MPU and the plurality of Branch Devices can interact to perform various processes or protocols such as Authentication process at block 660, Time and Half-Cycle Synchronization process at block 670, Energy Monitoring process at block 680 and Fault Detection process at block 690. For the purposes of discussion, the data flow 650 of FIG. 6C and FIG. 6D will be described below with reference to the main processing unit or MPU and Branch Device(s) (e.g., 1 . . . N).

As shown in FIG. 6C, the Authentication process at block 660, the Time and Half-Cycle Synchronization process at block 670 and the Monitoring process at block 680 can be implemented in a manner similar or the same as to the Authentication process at block 610, the Time and Half-Cycle Synchronization process at block 620 and the Monitoring process at block 630 as previously described above for the example of the data flow 600 of FIG. 6A.

Turning to the example of the Fault Detection process at block 690 in FIG. 6D, once the MPU detects any High Frequency (HF) event from its HF features, the MPU needs to know which Branch Device is seeing the fault as well. In this case, the Branch Devices can only monitor the low frequency measurements and potential perturbations that are caused by a load transition or potential arc fault due to impedance changes with the load from a broken wire or cabling. In this example, both the MPU and the Branch Devices can process these features for every half-cycle. Therefore, once the HF features pass a predetermined threshold for that half-cycle or a number of half-cycles, a broadcast message (e.g., Arc Fault Event) is sent out to all Branch Devices to report low frequency features that might have crossed a predetermined threshold as well. If a Branch Device does not see any changes in the LF features, then the Branch Device can respond with a NACK (see, e.g., Branch Device 2 and N).

As previously noted, there are different ways to implement when a branch device sees that LF features crossed a LF threshold. In a second example, the Arc Fault State machine (or process thereof) can reside or be implemented in the MPU and request LF features, e.g., LF Event Request, to be reported by the Branch Device (see, e.g., Branch Device 1) that detected changes that passed the threshold values for LF features.

If a Branch Device sees that LF features crossed a threshold, then it can report to the MPU with those feature values and the Zero-Cross ID for synchronizing those values with the HF frequency values in the MPU for entering the Arc Fault Detection (AFD) State Machine (or process thereof), e.g., ID 01: Respond with LF features. The AFD state machine can determine whether these features represent a transient state of the load or a potential fault. If this is a potential fault, the MPU can send another dedicated request to the Branch Device to collect and report LF features. For each set of LF features the AFD State Machine can determine the level of hazardous Fault and make the decision to command the Branch Device to terminate the load (e.g., AF Fault Event) and extinguish the Arc Fault (e.g., Load Disconnect). Once the load is powered off and the HF features fall below predetermined thresholds or do not indicate any potential Fault, the Monitoring process at block 680 of monitoring energy measurements can resume by notifying all the Branch Devices to continue to report Energy Measurement data based on their rate.

In the example embodiments of FIGS. 6A and 6B and FIGS. 6C and 6D described above, if the MPU continues to detect HF frequency features crossing the predetermined threshold, the MPU can broadcast again a HF Event message, or LF Event Request (depending on which example embodiment is configured) to see if other Branch Devices are seeing LF frequency features changing values above the predetermined thresholds. If neither of them sees anything they can respond with NACK and the MPU can request for Energy Monitoring reports.

Figure 7:
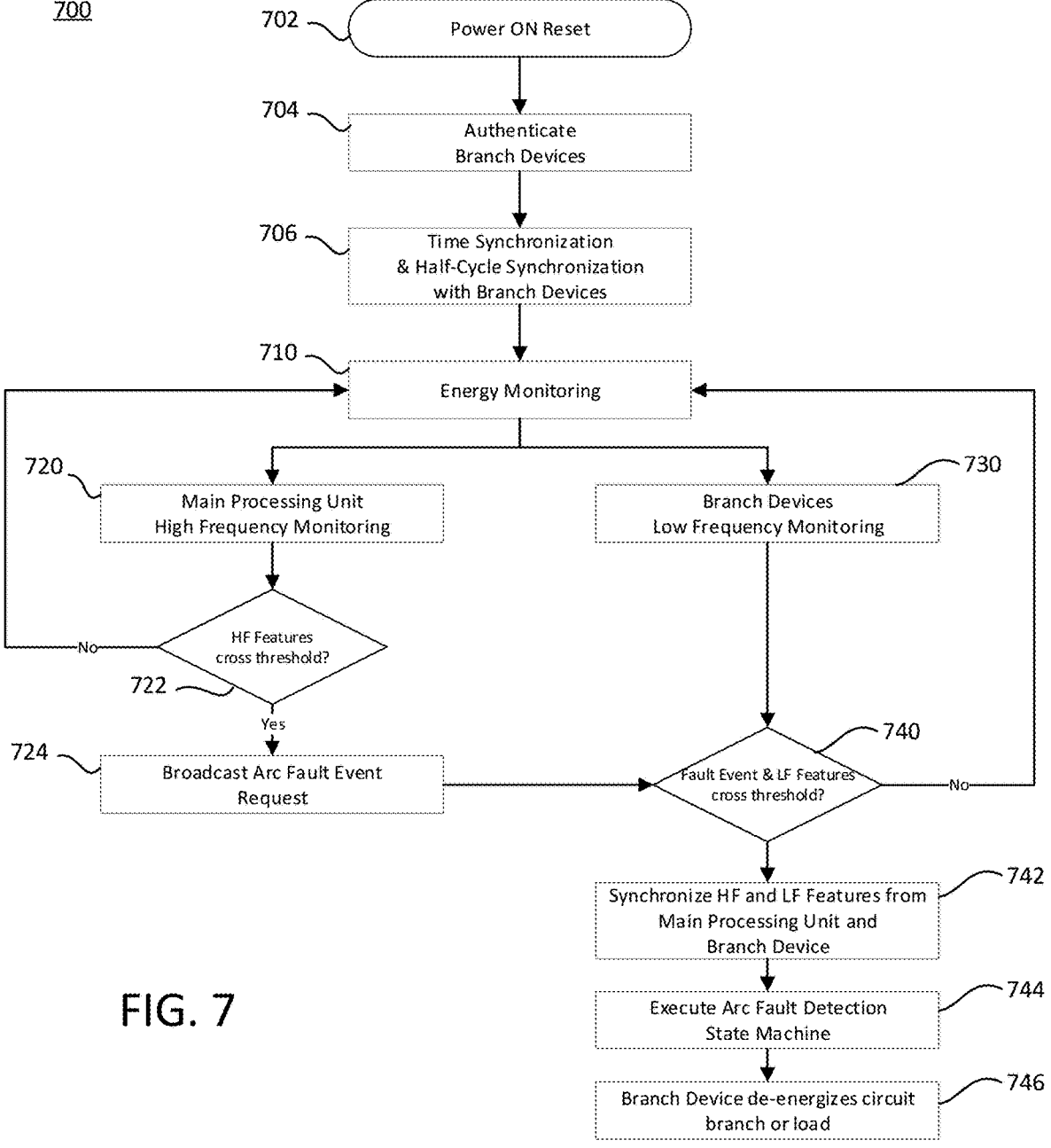
FIG. 7 illustrates a flow chart of an example process in which high frequency (HF) features (or components) are provided by a main processing unit to other devices including branch devices to perform arc fault detection, in accordance with an embodiment of the present disclosure.

FIG. 7 illustrates a flow chart of an example process 700 in which high frequency (HF) features (or components) are provided by a main processing unit (or MPU) to other devices including branch devices to perform coordinated arc fault detection, in accordance with an embodiment of the present disclosure.

The process 700 begins at block 702 in which the Branch Devices and its components are powered ON. For example, a power-on-rest (PoR) circuit can be employed to power the processor(s) of the Branch Devices at initial startup of the devices.

At block 704, the MPU authenticates the Branch Devices. For example, as previously explained, the MPU can have a list of registered devices on the local network(s), including Branch Devices. The MPU can query each of the registered Branch Devices, which can exchange keys and acknowledge messages so that the MPU can validate that the Branch Devices are present and up and running. Various authentication schemes can be employed to validate a presence and authenticity of devices on the local network(s).

At block 706, the MPU and the Branch Devices are synchronized. For example, as previously explained, the time synchronization can take advantage of a Simple Precision Time Synchronization algorithm, such as IEEE 1588.2008 or other proprietary ones. Because each Branch Device is connected with the MPU and is within the same network, the number of network hops between these devices and the MPU can be minimal. Besides synchronization of clocks with each Branch Device, a Zero-Cross number can be exchanged as well. Since all devices, the MPU and the Branch Devices are connected in the same AC power line, they all see the same voltage Zero-Crosses which can be used to synchronize their respective acknowledgement or ACK messages with respect to the zero-cross value. Once all the Branch Devices are synchronized with the MPU and they respond with the correct Zero-Cross id/count, the time synchronization process is completed, and each device can report measurement data to the MPU with the Zero-Cross value. If any of the Branch Devices reports measurements with a different zero-cross value, the MPU can initiate a time synchronization process with that specific device instead of with all the devices. Various time synchronization schemes can be employed to synchronize the MPU and Branch Devices.

At block 710, energy monitoring is performed. For example, each Branch Device can follow a Round-Robin scheduler to report their energy measurement as configured (e.g., Active Power, Power Factor, etc.) by the installer at a desired rate. This processing loop does not require the MPU to query the Branch Devices, but it can acknowledge their reported values and check their Zero-Cross ID for any desynchronization that could occur over time, which in this case it can initiate a time synchronization process with that device. It should be noted that energy measurements can be reported using other approaches, including but not limited to MPU or other querying of the Branch Devices, etc.

An arc fault detection process can be performed with the monitoring of high frequency (HF) and low frequency (LF) features by the MPU and Branch Devices. For example, the MPU performs HF monitoring at block 720 and each of the Branch Devices performs LF monitoring at block 730. In various embodiments, both the MPU and the Branch Devices can process these features for every half-cycle. For example, the MPU determines whether the HF features crosses (or satisfies) a predetermined HF threshold at block 722. If not, the MPU continues energy monitoring (e.g., block 710). Otherwise, if the HF features crosses the HF threshold for that half-cycle or a number of half-cycles, the MPU sends a broadcast message (e.g., Arc Fault Event) to each of the Branch Devices.

At block 740, each of the Branch Devices receives the broadcast message from the MPU, and determines whether their locally monitored LF features cross (or satisfy) a predetermined LF threshold to see if there are any changes in the LF features. If a Branch Device does not see any changes in the LF features (e.g., LF features does not cross the threshold), then the device can respond with a NACK. If a Branch Device does see changes in the LF features (e.g., LF features cross the LF threshold), the Branch Device can implement different arc fault detection example embodiments, such as: (1) requesting the HF features (or measurements/values associated therewith) from the MPU in a first example or (2) reporting its LF features (or measurements/values associated therewith) to the MPU and information for synchronizing the LF features (e.g., Zero-Cross ID) in a second example.

At blocks 742, 744 and 746, when a broadcast message is sent by the MPU and LF features cross the LF threshold for a particular Branch Device, the HF and LF features are synchronized, an AFD State Machine is executed to detect an occurrence/presence of an arc fault on the branch circuit associated with the Branch Device based on the synchronized HF and LF features, and the Branch Device is controlled to de-energize the circuit branch or load thereon in the event an arc fault is detected. As previously explained, in the first example, the Branch Device can receive the HF features requested from the MPU, synchronize the received HF features and the local LF features, detect for a presence/occurrence of an arc fault based on the synchronized HF and LF features, and de-energize the circuit branch or load (e.g., via a switch or trip unit/device). Alternatively, in the second example, the MPU can receive the LF features and synch info (e.g., Cross-Zero ID, etc.) reported from the Branch Device, synchronize the received HF features and the local LF features, detect for a presence/occurrence of an arc fault based on the synchronized HF and LF features, and remotely control the Branch Device to de-energize the circuit branch or load (e.g., via a switch or trip unit/device). These two AFD approaches are provided as examples. The AFD State Machine (or process thereof) can be performed at the MPU, Branch Device or other remote device using external HF features, in accordance with various embodiments.

Figure 8:
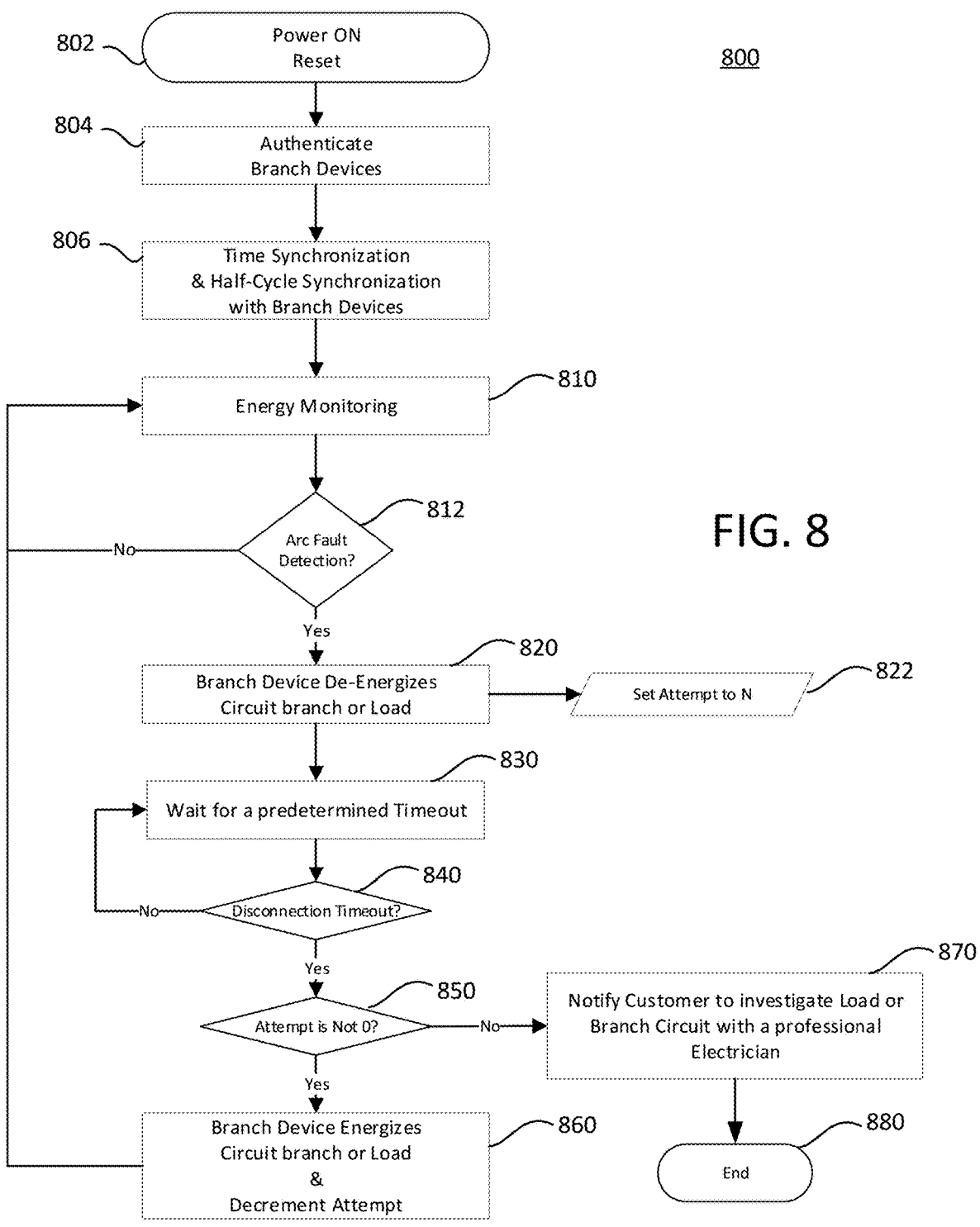
FIG. 8 illustrates a flow chart of an example process for load or branch circuit recovery in case a fault is extinguished and no longer present, in accordance with an embodiment of the present disclosure.

FIG. 8 illustrates a flow chart of an example process 800 for load or branch circuit recovery in case a fault is extinguished and no longer present, in accordance with an embodiment of the present disclosure. For example, once a branch device has disconnected the load due to a potential hazardous fault and the fault has been mitigated, it can try to re-activate that branch device load again after a certain amount of time. If the fault is still present and the HF features detect the same amount of changes above the predetermined thresholds, then the MPU and the Branch Device can follow one of the examples embodiments described herein to extinguish and mitigate the fault again and terminate the load. Otherwise, if the fault is no longer present, then the load can recover and operate which can allow the user to continue the work or use the load. This scenario is observed with some loads that during a certain operation they seem to be generating signals that are similar to signals that a hazardous Arc Fault (AF) generates; however, these can be transients while the load is switching from one mode of operation to another one. These transitions are main factors why branch devices such as for example AFCI devices experience nuisance trips, resulting in customer dissatisfaction. If these loads recover the operation again and they no longer generate fault signals, then they can be operational and provide service to the customer. However, if this continues to occur between few predetermined trials, then the MPU can completely terminate this load and notify the customer to investigate this particular load or branch circuit with a professional electrician. The example operations of the process 800 are described below.

The process 800 begins at block 802 with the Branch Devices being powered ON, and can perform authentication, synchronization and energy monitoring, such as described herein. For example, at block 804, the Branch Devices on the network are authenticated. At block 806, the MPU and the Branch Devices are synchronized. At block 810, energy monitoring is performed by the MPU and the Branch Devices.

At block 812, AF detection is performed to detect for a presence/occurrence of an arc fault. If an AF is not detected for a Branch Device (or its associated branch circuit), the process 800 proceeds back to energy monitoring 810. Otherwise, if an AF is detected for at least one Branch Device, the process 800 proceeds to block 820 for that Branch Device with the detected fault.

At block 820, the Branch Device is controlled to de-energize the circuit branch or load thereon with the detected arc fault. At block 822, a counter related to tracking a number of re-energization attempts, such as "Attempt" (or other representative data value), is set to a number N, e.g., Attempt=N. As will be explained below, the Attempt can be a value or count for a maximum number of re-energization attempts after de-energization in response to a detected AF for a branch circuit or associated Branch Device before a problem is flagged for further action.

At block 830, the Branch Device waits for a predetermined disconnection period of time, e.g., a predetermined disconnection timeout period. For example, the Branch Device waits for a time period associated with the disconnection timeout period.

At block 840, the Branch Device determines whether the time period for a disconnection timeout has been reached (or has expired). If the time out period has not been reached, the process 800 proceeds back to block 830 and continues to wait for the predetermined timeout to be completed. Otherwise, if the disconnection timeout has been met or has elapsed, the process 800 proceeds to block 850.

At block 850, the Branch Device determines whether the number of re-energization attempts has reached zero, e.g., Attempt=0. If the number of attempts is not zero, e.g., Attempt>0, the Branch Device can energize the circuit branch or load, and decrement the number of attempts (e.g., Attempt=Attempt−1). In this way, the branch circuit and load(s) thereon can become operational again. The process 800 thereafter proceeds back to block 810 to perform energy monitoring of the circuit. Otherwise, upon determining that a data value representing a number of times an attempt has been made to energize the branch circuit satisfies or crosses an attempt threshold (such as for example if the number of attempts is zero, e.g., Attempt=0), the Branch Device can take various actions. The actions can include preventing or delaying energization/re-energization at the branch device. The actions also can include notifying the customer to investigate the branch circuit or load(s) thereon with a professional electrician (e.g., a Technician, etc.) at block 870, or other actions to investigate, analyze or rectify AF hazards on the branch circuit or load(s) thereon. The process 800 thereafter terminates at block 880.

The disconnection period of time and attempt processing can be performed for each Branch Device which has de-energized its associated branch circuit in response to AF detection. The number of attempts may also be subject to a time constraint, e.g., the number of attempts can be reset after a predetermined time period (or duration). Although the above recovery or related processes (e.g., blocks 820 through 880) are described with reference to the Branch Device, the recovery process and operations thereof can be performed for each Branch Device by the MPU or can be performed through cooperation between each Branch Device and the MPU. For example, Attempt tracking can be performed by the Branch Device or MPU. In the event Attempt tracking is performed for a branch device/branch circuit, the MPU can control the operations of the related branch device as needed.

The above fault recovery method and system associated therewith of FIG. 8 are provided as an example. In various embodiment, the method and system can further involve: detecting, at a branch device (e.g., 120, 130 of FIG. 1, etc.) or at a central (or centralized) monitoring device (e.g., MPU 110 of FIG. 1, etc.) on behalf of the branch device, an arc fault on the branch circuit, the branch device being a branch device from a plurality of branch devices on the branch circuit, and de-energizing, at the branch device, the branch circuit in response to the detected arc fault on the branch circuit. Furthermore, the predetermined disconnection time out for the branch device can be of an adequate duration to allow any other branch device, which is downstream from the branch device, to perform detection and de-energization operations for the arc fault before the branch device attempts to energize the branch circuit.

In some embodiments, a data value representing a number of attempts (or information thereof) can be maintained and updated at the branch device, or at the central monitoring device. The data value representing a number of attempts also can be maintained and updated for a branch device and/or for a branch circuit including a plurality of branch devices thereon (e.g., a cumulative number of attempts of all of the branch devices on the branch circuit). The delay or prevention of energization as well as notification can be based on the number of attempts for a branch device and/or for the branch circuit.

Furthermore, a de-energization or trip response time for performing de-energization or tripping operation at the branch device to de-energize the branch circuit can be based on at least a size of or current being drawn by a load(s) connected to the branch circuit via the branch device. The method and system can further involve: determining a de-energization or trip response time for the branch device to de-energize the branch circuit based on at least a size of or current being drawn by a load(s) connected to the branch device. Furthermore, the determining a de-energization or trip response time can determine the de-energization or trip response time for the branch device based on at least a size of a load(s) connected to the branch devices relative to a size of or current being drawn by a load(s) connected to other branch devices on the branch circuit. The de-energization or trip response time for each of the branch devices on the branch circuit can be less or faster for a larger load(s), or can be greater or slower for a smaller load(s) relative to other branch devices on the branch circuit. In some embodiments, the response time can be calculated as a function of the size (or current draw) of the load(s) for a branch device, or selected from a Table of response times according to the size (or current draw) of the load(s) for a branch device. The response time also can be dependent on the load application, which can also can be taken into account in the function or Table of response times.

In various embodiment, the method and system can further involve: detecting a relative location of the detected arc fault along the branch circuit based on a detected presence or absence of an arc fault by other branch devices on the branch circuit; and allowing the branch devices upstream of the detected location of the arc fault to remain energized on the branch circuit or to re-energize the branch circuit. The relative location of an arc fault on a branch circuit can be determined from information related to any detected presence or absence of an arc fault by the branch devices on the branch circuit, where the relative location of the each branch device to other devices on the branch circuit are known. Such information may be exchanged between the central monitoring device, the branch devices, and other devices described herein.

In various embodiments, the method and system can further involve: de-energizing the entire branch circuit if two or more branch devices from the plurality of branch devices on the branch circuit detect an arc fault on the branch circuit; and notifying a user of a hazardous condition associated with the branch circuit or branch devices thereon. For example, the detection by two or more branch devices of an arc fault can reflect the presence of an upstream arc fault, which may necessitate the de-energization of the entire branch circuit, and the notification of a user to check on the branch circuit and its branch devices and connected loads.

As described above, the system and method can involve: energizing, at a branch device, a branch circuit after expiry of a predetermined disconnection period of time that was initiated in response to a detected arc fault on the branch circuit; updating, using one or more computer processors, a data value representing a number of times an attempt has been made to energize the branch circuit in response to detected arc faults on the branch circuit; and upon determining that the data value satisfies or crosses an attempt threshold, preventing or delaying at the branch device the energizing of the branch circuit.

In some embodiments, the energizing operation, the updating operation and the preventing or delaying operation can be performed by the branch device. Furthermore, the branch circuit can include a plurality of branch devices including the branch device, and each of the branch devices can be configured to perform the energizing operation, updating operation, and preventing or delaying operation.

In some embodiments, the branch circuit can include a plurality of branch devices including the branch device. Each of the branch devices can be configured to perform the energizing operation, and a central monitoring device in communication with and control of the branch devices can be configured to perform or control the updating operation, and the preventing or delaying operation.

In some embodiments, there can be a plurality of branch circuits, with each of the branch circuits including a plurality of branch devices. The method and system can further involve: coordinating, via a central monitoring device in communication with and control of each of the branch devices on the branch circuits, a performance or control of the energizing operation, the updating operation, and the preventing or delaying operation. Furthermore, the branch devices on the branch circuits can include circuit breakers, which are maintained in a load center. The central monitoring device can be located inside or outside of the load center, and can be an MPU such as described herein.

FIG. 9 illustrates a flow chart of an example process 900 of performing arc fault detection of one or more branch circuits using HF features (or components) determined upstream of the one or more branch circuits or their branch devices, in accordance with an embodiment of the present disclosure. By way of example explanation, the process 900 will be described with reference to upstream device(s) and branch device(s). In this example, the upstream device can be a main processing unit or MPU.

At block 910, an upstream device, via a sensor, measures (or monitors) electrical signals upstream of at least one branch circuit on a power distribution system. The upstream device can for example be a main switch or breaker of a load center or other circuit protective device, and the sensor can be a current sensor, voltage sensor or other sensor for measuring electrical properties of an electrical signal(s).

At block 920, the measured electrical signals are processed by a processor(s) of the upstream device to determine high frequency/HF features (or components).

At block 930, a branch device of the at least one branch circuit, via a sensor, measures electrical signals on the at least one branch circuit. The branch device can for example be a circuit interrupter, circuit breaker, wiring device or other circuit protective device, and the sensor can be a current sensor, voltage sensor, or other sensor for measuring electrical properties of an electrical signal(s).

At block 940, the measured electrical signals on the at least one branch circuit are processed by a processor(s) of the branch device to determine high frequency/HF features (or components).

At block 945, HF and LF features are synchronized for each branch circuit.

At block 950, arc fault detection for the at least one branch circuit by the upstream device or the branch device, based on the HF features and the LF features. For example, in various embodiments, the upstream device can communicate (e.g., transmit) information of the determined HF features to the branch device so the branch device can perform arc fault detection. Alternatively, one or more branch devices can communicate information of the determined LF features to the upstream device so the upstream device can perform arc fault detection for their respective branch circuits (or monitored phases or lines).

Furthermore, the determined HF features and LF features can be synchronized, and provided as input into an arc fault detection algorithm (or process) implemented on one or more processors to detect for an occurrence of an arc fault on at least one branch circuit.

At block 960, in response to detection of an arc fault on the at least one branch circuit, one or more actions can be taken (e.g., interrupt power supplied to the branch via switch or other interrupt/switch configuration). For example, the branch device can interrupt power to the at least one branch circuit, and/or the upstream device can interrupt power to the at least one branch circuit. The interruption of power by the branch device can be performed in response to arc fault detection performed locally or under remote control by the upstream device.

The above method is provided as an example in which the HF features are determined externally from the branch device(s), such as by the upstream device. The determined HF features can be common HF features, which can be used for arc detection of one or more branch circuits or by one or more branch devices to perform arc fault detection.

Figure 10:
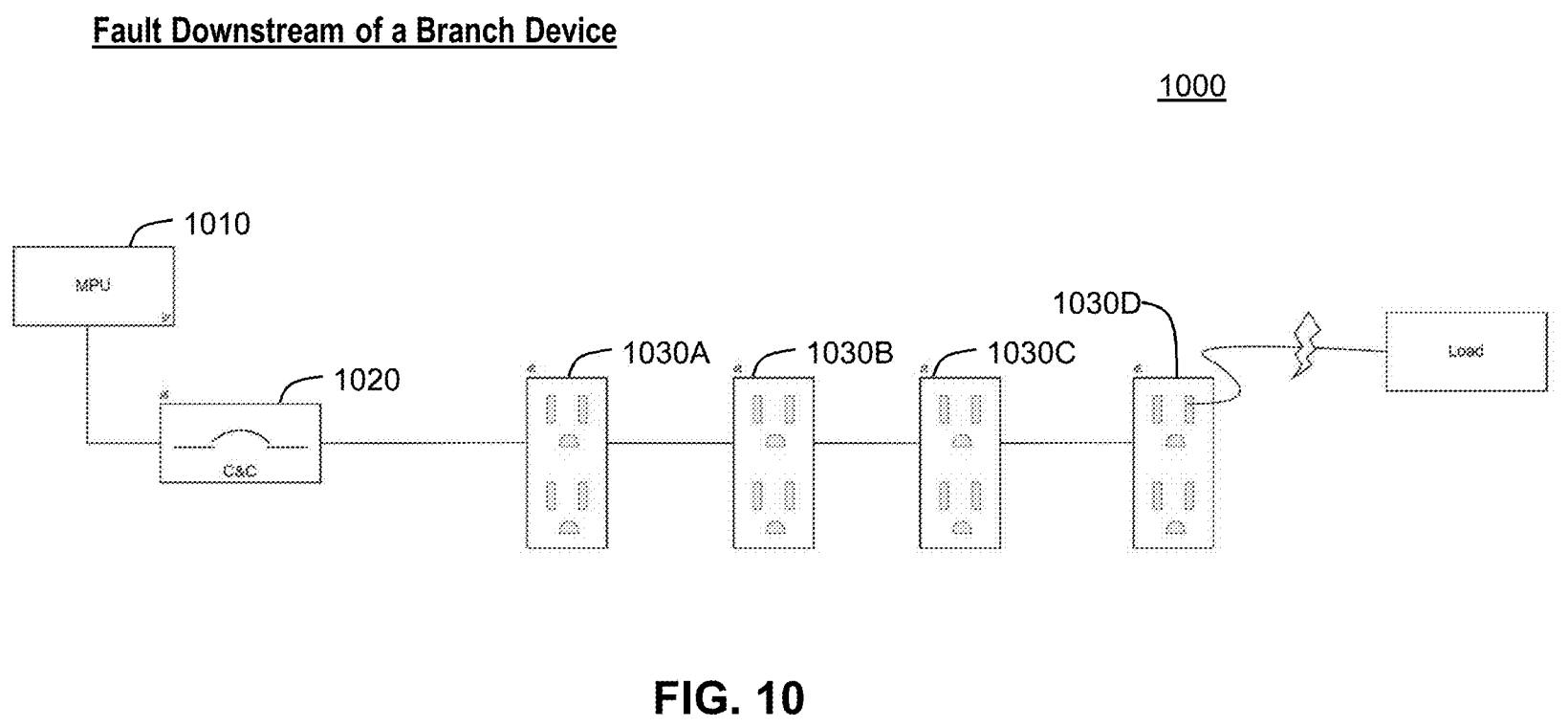
Figure 11:
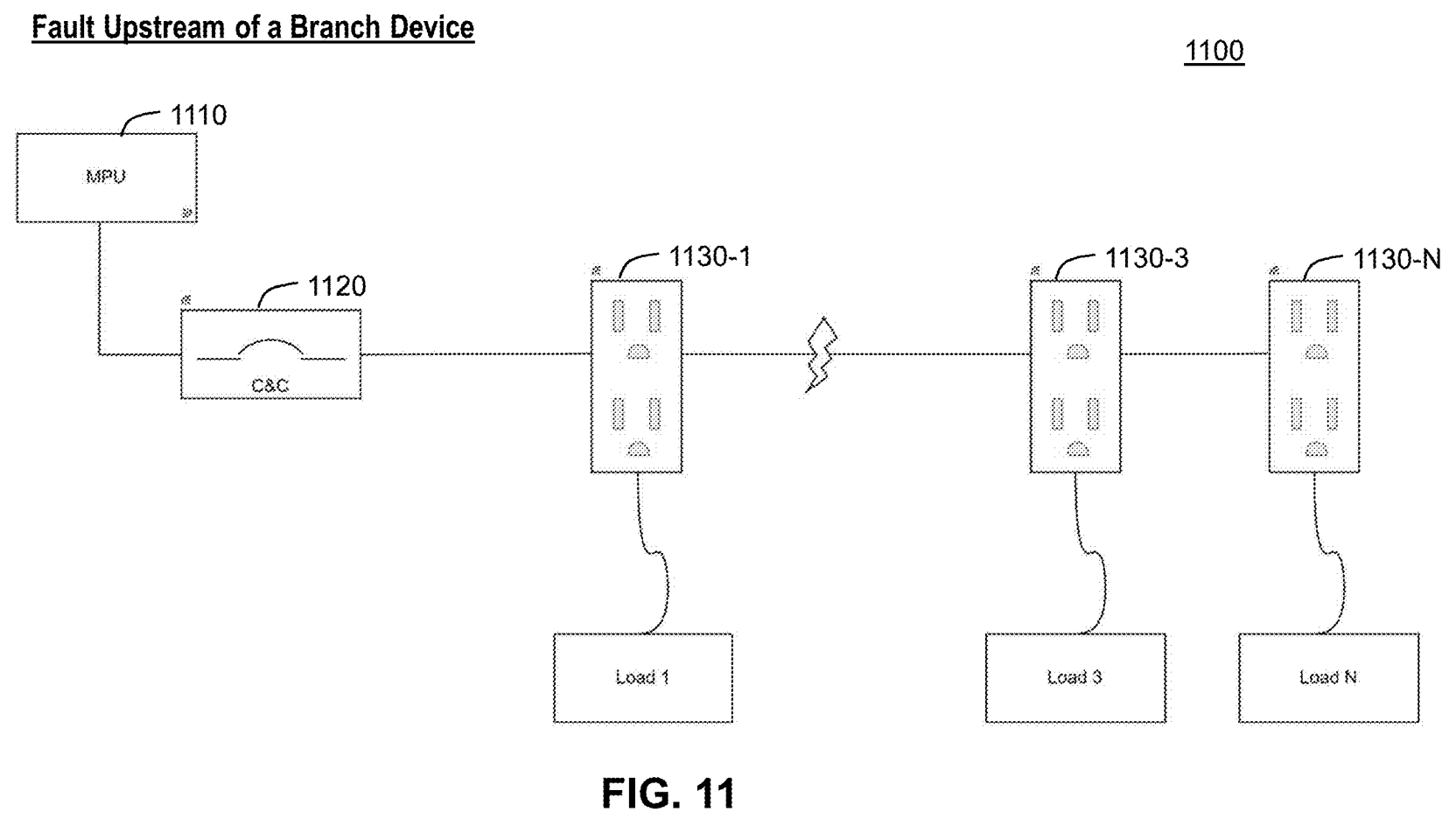

FIGS. 10 and 11 illustrate example scenarios in relation to the fault recovery method and system described above. For example, while one branch circuit is de-energized and a timeout period is set for waiting to re-energize the circuit, there may still be a fault present. In some cases, the decision for each branch device may be different as to when to de-energize the load. Therefore, in such scenarios, each branch device may coordinate with a central monitoring device, such as an MPU, to determine whether or not to de-energize its respective load(s). Alternatively, each branch device can coordinate with other branch devices on the branch circuit to determine whether or not to de-energize its respective load(s).

In FIG. 10, an example fault scenario 1000 is illustrated with reference to an MPU 1010, and branch devices 1020, 1030A through 1030D connected on a branch circuit. The branch device 1120 can be a circuit breaker, which may be located in a load center. The branch devices 1030A through 1030D can be an electrical outlet or receptacle such as shown or other branch device as described herein. Each of the branch devices 1030A through 1130D can have a load(s) connected thereto, which may differ in size or in an amount of current being drawn. Each branch circuit 1030A through 1030D can include a switch or other power interruption device, to energize or de-energize the portion of the branch circuit (including load circuit) downstream of the branch device, e.g., turn ON or OFF an upstream power supply to the portion of the branch circuit (including a load circuit(s)) which is downstream of the branch device.

In this scenario 1000, the fault is downstream of a branch device (e.g., load circuit of the branch device), where the decision to de-energize the last branch device 1030D shown in FIG. 10 can mitigate the fault by disconnecting the load, waiting for some time, and afterwards re-energizing if the fault is no longer present (and then keeping the circuit/ branch device energized). In this case, the electrical system can be a home (or house). The fault can be eliminated either by the homeowner disconnecting the faulty load from the branch device 1030D, or if the load itself does not exhibit any faults on consecutive re-energizing events due to fault-noisy nature of the load.

In FIG. 11, an example fault scenario 1100 is illustrated with reference to an MPU 1110, and branch devices 1120, 1130-1 through 1130-N connected on a branch circuit (where N is the number of branch devices). The branch device 1120 can be a circuit breaker, which may be located in a load center. The branch devices 1130-1 through 1130-N can be an electrical outlet or receptacle such as shown or other branch device as described herein. Each of the branch devices 1130-1 through 1130-N can have a load(s) connected thereto, which may differ in size or in an amount of current being drawn. Each branch circuit 1130-1 through 1130-N can include a switch or other power interruption device, to energize or de-energize the portion of the branch circuit (including load circuit) downstream of the branch device, e.g., turn ON or OFF an upstream power supply to the portion of the branch circuit (including a load circuit(s)) which is downstream of the branch device.

As shown in the fault scenario 1110 of FIG. 11, there is a fault upstream of a branch device (e.g., 1130-3 and 1130-N) on the branch circuit protected by a circuit breaker 1120. In this scenario 1100, the fault may be detected by one or more of the branch devices 1130-3 and/or 1130-N, which are downstream of the branch devices, such as the circuit breaker 1120 and the branch device 1130-1. Depending on their load scenarios, one branch device may decide to de-energize the circuit faster than the other branch device(s). For example, where Load 3 is larger than Load N, the branch device 1130-3 with the Load 3 may be configured to make a faster de-energize decision as compared to the branch device 1130-N with the Load N. Therefore, the timeout value can be configured to be sufficiently or adequately large enough (e.g., a few seconds) that the other branch devices can de-energize as well, before trying to re-energize the load back again.

It should be noted that if more than one of the branch devices 1130-1 through 1130-N are detecting faults, this can indicate a presence of a fault upstream of the branch devices (e.g., upstream of 1130-3 and 1130-N). In such a case, the entire branch circuit may need to be de-energized, and a notification can be outputted to a user (e.g., an electrician, etc.) via the user device or through a central monitoring device to investigate and fix the fault somewhere in the upstream connections of the branch devices.

This cascaded de-energize decision can also help the user identify the location of the fault relative to the location of each branch device 1130 that identified a fault and the ones that did not. The example scenarios of FIG. 10 and FIG. 11 are provided as examples of the actions, which may be taken depending on when or by which device along a circuit a fault is detected. The actions in these examples can be applicable to other fault detection scenarios and implemented by one or more branch devices along a branch circuit.

Figure 12:
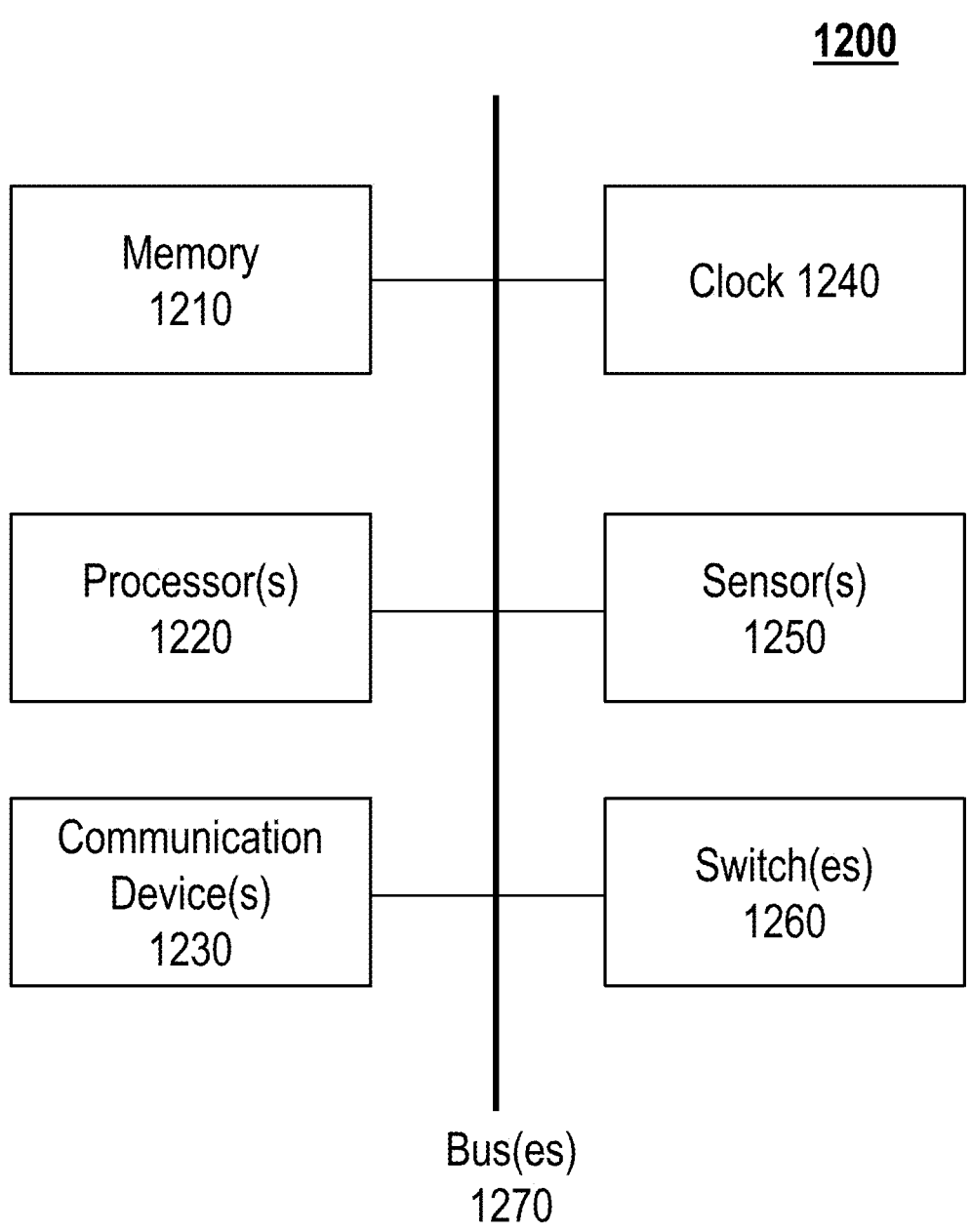
FIG. 12 illustrates example components of a circuit protective device, such as an AFCI or other circuit interrupter, circuit breaker, main switch (or breaker), or other circuit protective and/or metering device, for use on a power distribution system, in accordance with an embodiment.

FIG. 12 illustrates example components of a computer-implemented device (or system) 1200 such as a MPU, branch device or other device with processing and communication capabilities, for use on an electrical system, in accordance with an embodiment.

The system 1200 can include memory 1210, processor(s) 1220, communication device(s) 1230, clock 1240, sensor(s) 1250 and switch(es) 1260, which can be communicatively connected via wireless or wireline communication. In this example, the various components can be communicatively connected via buses 1270. The clock 1240 can be used to time-stamp data or an event with a time value, and synchronize operations within the device and with remote devices or a system. The communication device 1230 can include transmitters and receivers for conducting wireless communications or wireline communications with other remote devices.

The memory 1210 can store computer executable code, programs, software, or instructions, which when executed by a processor(s), controls the operations of the device 1200, including the various processes described herein. The memory 1210 can also store other data used by the device 1200 or components thereof to perform the operations described herein. The other data can include but is not limited to HF and/or LF features (or components), arc fault detection programs/algorithm or other fault detection programs/algorithms, and other data described herein.

The processor(s) 1220, which interacts with the other components of the computer-implemented device, is configured to control or implement the various operations and functions described herein.

The sensor(s) 1250 is configured to measure electrical properties of electrical signals on one or more conductors of a power distribution system or portions thereof. The sensor 1050 can be a current sensor, voltage sensor or other sensor from which current or voltage or its representative waveform signal(s) can be derived. The sensor 1250 can be configured to measure desired frequency ranges of the monitored electrical property. For example, in various embodiments, a sensor for an upstream device can be configured to measure electrical signals (and their waveforms) in high frequency range(s) in the context of fault detection, and a sensor for a branch device can be configured to measure electrical signals (and their waveforms) in low frequency range(s) in the context of fault detection.

The switch(es) 1260 can be a switch for connecting or disconnecting a supply of electrical power to or from a portion of an electrical system, e.g., a circuit such as a branch circuit of a power distribution system. The switch 1260 can be tripped or operated automatically in response to a triggering event (e.g., detection of a fault, remote command, etc.) or manually by a user. The switch 1260 also can be controlled locally or remotely to energize or de-energize a circuit or a device(s) connected thereto.

The above describes example components of a computer-implemented device such as a MPU, branch device or other device with processing and communication capability described herein. The computer-implemented device may or may not include all of the components of FIG. 12, and may include other additional components to facilitate operation of the processes and features described herein. For example, the computer-implemented device may also include input device(s) and output device(s), signal conditioning circuits, and so forth.

The centralized or coordinated approach for arc fault detection (or aspects thereof) and fault recovery as discussed herein can be employed with different device topologies, which can include, for example, a plurality of wiring devices and a central device which are connected to receive power from a power distribution system. For example, the wiring devices can be configured to determine locally LF features, and a central device can be configured to determine common HF features, which may be used by the wiring devices or the central device to perform arc fault detection. The central device or main processing device can be one of the plurality of wiring devices, the most upstream wiring device from the plurality of wiring devices, or a circuit protective device or other type of device connected to the distribution system. Although wiring devices are described in this example, the topology can include wiring devices, circuit protective devices, other types of devices or a combination thereof. The power distribution system can also be a multi-phase system.

Furthermore, the various methods, processes or algorithms described herein, including their operations or functions, can be performed or controlled through a central device/central monitoring device (e.g., MPU), a branch device(s) (e.g., circuit breakers, wiring devices, etc.) or a combination thereof which can involve collaboration between the central device/central monitoring device and the branch devices as well as collaboration between branch devices on the same or different branch circuits. As would be understood, various information can be communicated and/or exchanged between the central device/central monitoring device, the branch devices, and other devices described herein (e.g., user device, etc.) for use in performing the various operations or functions of the methods, processes or algorithms described herein. Such information can include LF features, HF features, detection of arc fault and identity/ location of the detecting device, control commands or signals (e.g., to perform action including provision of information, energization/de-energization of a circuit, etc.), the size of the load(s) connected to a branch device, predetermined disconnection time out (or table of time outs from which to select), de-energization or trip response time (or table of response time from which to select), device location and operating parameters, information associated therewith or other information relevant to the operations and functions as described herein.

It should also be understood that the example embodiments disclosed and taught herein are susceptible to numerous and various modifications and alternative forms. Thus, the use of a singular term, such as, but not limited to, "a" and the like, is not intended as limiting of the number of items. Furthermore, the naming conventions for the various components, functions, characteristics, thresholds, and other elements used herein are provided as examples, and can be given a different name or label. The use of the term "or" is not limited to exclusive "or", but can also mean "and/or".

It will be appreciated that the development of an actual, real commercial application incorporating aspects of the disclosed embodiments will require many implementation specific decisions to achieve the developer's ultimate goal for the commercial embodiment. Such implementation specific decisions may include, and likely are not limited to, compliance with system related, business related, government related and other constraints, which may vary by specific implementation, location and from time to time. While a developer's efforts might be complex and time consuming in an absolute sense, such efforts would nevertheless be a routine undertaking for those of skill in this art having the benefit of this disclosure.

Using the description provided herein, the example embodiments may be implemented as a machine, process, or article of manufacture by using standard programming and/or engineering techniques to produce programming software, firmware, hardware, or any combination thereof.

Any resulting program(s), having computer-readable program code, may be embodied on one or more tangible or non-transitory computer-usable media such as resident memory devices, smart cards or other removable memory devices, or transmitting devices, thereby making a computer program product or article of manufacture according to the embodiments. As such, the terms "article of manufacture" and "computer program product" as used herein are intended to encompass a computer program that exists permanently or temporarily on any computer-usable or storage medium or in any transmitting medium which transmits such a program.

A processor(s), controller(s) or processing unit(s) as described herein can be a processing system, which can include one or more processors, such as CPU, controller, ASIC, or other processing unit or circuitry, which controls or performs the operations of the devices or systems, described herein. Memory/storage devices can include, but are not limited to, disks, solid state drives, optical disks, removable memory devices such as smart cards, SIms, WIMs, semiconductor memories such as RAM, ROM, PROMS, etc. Transmitting mediums or networks include, but are not limited to, transmission via wireline communication, wireless communication (e.g., Radio Frequency (RF) communication, Bluetooth®, Wi-Fi, Li-Fi, etc.), the Internet, intranets, telephone/modem-based network communication, hard-wired/cabled communication network, satellite communication, and other stationary or mobile network systems/communication links.

The flowchart and block diagrams in the Figures illustrate the architecture, functionality and/or operation of possible implementations of various embodiments of the present disclosure. In this regard, each block in the flowchart or block diagrams may represent a module, segment or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While particular embodiments and applications of the present disclosure have been illustrated and described, it is to be understood that the present disclosure is not limited to the precise construction and compositions disclosed herein and that various modifications, changes, and variations can be apparent from the foregoing descriptions without departing from the invention as defined in the appended claims.

What is claimed is:

1. A method of load or branch circuit recovery from a fault(s) on an electrical system, comprising:
   de-energizing an entire branch circuit if two or more branch devices from a plurality of branch devices on a branch circuit detect an arc fault on the branch circuit;
   energizing, at a branch device of the two or more branch devices, the branch circuit after expiry of a predetermined disconnection period of time that was initiated in response to the detected arc fault on the branch circuit;
   updating, using one or more computer processors, a data value representing a number of times an attempt has been made to energize the branch circuit in response to detected arc faults on the branch circuit; and
   upon determining that the data value satisfies or crosses an attempt threshold, preventing or delaying at the branch device the energizing of the branch circuit.

2. The method according to claim 1, further comprising:
   upon determining that the data value satisfies or crosses an attempt threshold, notifying a user of a hazardous condition associated with the branch circuit or device(s) thereon.

3. The method according to claim 1, further comprising:
   detecting, at the branch device or at a central monitoring device on behalf of the branch device, an arc fault on the branch circuit, the branch device being a branch device from a plurality of branch devices on the branch circuit, and
   de-energizing, at the branch device, the branch circuit in response to the detected arc fault on the branch circuit.

4. The method according to claim 3, wherein the predetermined disconnection period of time for the branch device is of an adequate duration to allow any other branch device, which is downstream from the branch device, to perform detection and de-energization operations for the arc fault before the branch device attempts to energize the branch circuit.

5. The method according to claim 3, wherein a de-energization or trip response time for performing de-energization or tripping operation at the branch device to de-energize the branch circuit is based on at least a size of or current being drawn by a load(s) connected to the branch circuit via the branch device.

6. The method according to claim 5, further comprising:
determining a de-energization or trip response time for the branch device to de-energize the branch circuit based on at least a size of or current being drawn by a load(s) connected to the branch device.

7. The method according to claim 6, wherein the determining a de-energization or trip response time determines the de-energization or trip response time for the branch device based on at least a size of a load(s) connected to the branch devices relative to a size of or current being drawn by a load(s) connected to other branch devices on the branch circuit.

8. The method according to claim 7, wherein the de-energization or trip response time for each of the branch devices on the branch circuit is less or faster for a larger load(s), or is greater or slower for a smaller load(s) relative to other branch devices on the branch circuit.

9. The method according to claim 5, further comprising:
detecting a relative location of the detected arc fault along the branch circuit based on a detected presence or absence of an arc fault by other branch devices on the branch circuit; and
allowing the branch devices upstream of the detected location of the arc fault to remain energized on the branch circuit or to energize the branch circuit.

10. The method according to claim 3, further comprising:
notifying a user of a hazardous condition associated with the branch circuit or branch devices thereon.

11. The method according to claim 1, wherein the energizing operation, updating operation, and preventing or delaying operation are performed by the branch device.

12. The method according to claim 11, wherein the branch circuit includes a plurality of branch devices including the branch device, and each of the branch devices is configured to perform the energizing operation, updating operation, and preventing or delaying operation.

13. The method according to claim 1, wherein the branch circuit includes a plurality of branch devices including the branch device, and
wherein each of the branch devices is configured to perform the energizing operation, and a central monitoring device in communication with and control of the branch devices is configured to perform or control the updating operation, and the preventing or delaying operation.

14. The method according to claim 1, wherein the branch circuit is one of a plurality of branch circuits, each of the branch circuits including a plurality of branch devices, the method further comprising:
coordinating, via a central monitoring device in communication with and control of each of the branch devices on the branch circuits, a performance or control of the energizing operation, the updating operation, and the preventing or delaying operation.

15. The method according to claim 14, wherein the branch devices on the branch circuits include circuit breakers, which are maintained in a load center, the central monitoring device being located inside or outside of the load center.

16. A system for load or branch circuit recovery from a fault(s) on an electrical system, comprising:
a memory;
a processor(s) configured to perform or control:
detect, at a branch device or at a central monitoring device on behalf of the branch device, an arc fault on a branch circuit, the branch device being a branch device from a plurality of branch devices on the branch circuit;
de-energize at the branch device the branch circuit in response to the detected arc fault on the branch circuit, wherein a de-energization or trip response time for performing de-energization or tripping operation at the branch device to de-energize the branch circuit is based on at least a size of or current being drawn by a load(s) connected to the branch circuit via the branch device;
energize, at the branch device, the branch circuit after expiry of a predetermined disconnection period of time that was initiated in response to the detected arc fault on the branch circuit;
update a data value representing a number of times an attempt has been made to energize the branch circuit in response to detected arc faults on the branch circuit; and
upon determining that the data value satisfies or crosses an attempt threshold, prevent or delay at the branch device the energizing of the branch circuit.

17. The system according to claim 16, wherein the processor(s) is further configured to perform or control:
upon determining that the data value satisfies or crosses an attempt threshold, notifying a user of a hazardous condition associated with the branch circuit or device(s) thereon.

18. The system according to claim 16, wherein the predetermined disconnection period of time for the branch device is of an adequate duration to allow any other branch device, which is downstream from the branch device, perform detection and de-energization operations for the arc fault before the branch device attempts to energize the branch circuit.

19. The system according to claim 16, wherein the processor(s) is further configured to perform or control:
determining a de-energization or trip response time for the branch device to de-energize the branch circuit based on at least a size of or current being drawn by a load(s) connected to the branch device.

20. The system according to claim 19, wherein the processor(s) is configured to determine the de-energization or trip response time for the branch device based on at least a size of a load(s) connected to the branch devices relative to a size of or current being drawn by a load(s) connected to other branch devices on the branch circuit.

21. The system according to claim 20, wherein the de-energization or trip response time for each of the branch devices on the branch circuit is less or faster for a larger load(s), or is greater or slower for a smaller load(s) relative to other branch devices on the branch circuit.

22. The system according to claim 16,
wherein the processor(s) is further configured to perform or control:
detecting a relative location of the detected arc fault along the branch circuit based on a detected presence or absence of an arc fault by other branch devices on the branch circuit; and
allowing the branch devices upstream of the detected location of the arc fault to remain energized on the branch circuit or to energize the branch circuit.

23. The system according to claim 16, wherein the energizing operation, updating operation, and preventing or delaying operation are performed by the processor(s) of the branch device.

24. The system according to claim 23, wherein the branch circuit includes a plurality of branch devices including the branch device, and each of the branch devices including a processor(s), and the processor(s) of each of the branch devices is configured to perform the energizing operation, updating operation, and preventing or delaying operation.

25. The system according to claim 16, wherein the branch circuit includes a plurality of branch devices including the branch device, and the processor(s) includes a processor(s) of each of the branch device(s) and a processor(s) of a central monitoring device in communication with and control of the branch devices, and wherein each of the branch devices is configured to perform the energizing operation, and the central monitoring device is configured to perform or control the updating operation, and the preventing or delaying operation in relation to each of the branch devices.

26. The system according to claim 16, wherein the branch circuit is one of a plurality of branch circuits, each of the branch circuits including a plurality of branch devices, the processor(s) including a processor(s) of each of the branch devices and a processor(s) of a central monitoring device in communication with and control of each of the branch devices on the branch circuits, and wherein the processor(s) of the central monitoring device is configured to coordinate performance or control of the energizing operation, the updating operation, and the preventing or delaying operation in relation to one of, a plurality of or each of the branch devices.

27. The system according to claim 26, wherein the branch devices on the branch circuits include circuit breakers, which are maintained in a load center, the central monitoring device being located inside or outside of the load center.

28. A system for load or branch circuit recovery from a fault(s) on an electrical system, comprising:

a memory;

a processor(s) configured to perform or control:

de-energize an entire branch circuit if two or more branch devices from a plurality of branch devices on a branch circuit detect an arc fault on the branch circuit;

energize, at a branch device of the two or more branch devices, the branch circuit after expiry of a predetermined disconnection period of time that was initiated in response to the detected arc fault on the branch circuit;

update a data value representing a number of times an attempt has been made to energize the branch circuit in response to the detected arc faults on the branch circuit; and upon determining that the data value satisfies or crosses an attempt threshold, prevent or delay at the branch device the energizing of the branch circuit.

29. The system according to claim 28, wherein the processor(s) is further configured to perform or control:

notifying a user of a hazardous condition associated with the branch circuit or branch devices thereon.

30. The system according to claim 28, wherein the processor(s) is further configured to perform or control:

upon determining that the data value satisfies or crosses an attempt threshold, notifying a user of a hazardous condition associated with the branch circuit or device(s) thereon.

31. A non-transitory computer medium storing computer executable code, which when executed by one or more processors, is configured to implement a method comprising:

controlling energizing, at a branch device, a branch circuit after expiry of a predetermined disconnection period of time that was initiated in response to a detected arc fault on the branch circuit;

detecting a relative location of the detected arc fault along the branch circuit based on a detected presence or absence of an arc fault by other branch devices on the branch circuit;

updating a data value representing a number of times an attempt has been made to energize the branch circuit in response to detected arc faults on the branch circuit; and upon determining that the data value satisfies or crosses an attempt threshold, preventing or delaying at the branch device the energizing of the branch circuit.

* * * * *